US012593598B2

(12) United States Patent
Han

(10) Patent No.:  US 12,593,598 B2
(45) Date of Patent:     Mar. 31, 2026

(54) DISPLAY APPARATUS HAVING DAM STRUCTURES AND AN INSULATING MATERIAL AND METHOD OF MANUFACTURING THE SAME

(71) Applicant: Samsung Display Co., Ltd., Yongin-Si (KR)

(72) Inventor: Mijung Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 684 days.

(21) Appl. No.: 17/965,798

(22) Filed: Oct. 14, 2022

(65) Prior Publication Data

US 2023/0122131 A1     Apr. 20, 2023

(30) Foreign Application Priority Data

Oct. 14, 2021     (KR) ........................ 10-2021-0136898

(51) Int. Cl.
  *H10K 59/80*      (2023.01)
  *H10K 59/12*      (2023.01)
  *H10K 59/124*     (2023.01)
  *H10K 71/00*      (2023.01)

(52) U.S. Cl.
  CPC ......... *H10K 59/873* (2023.02); *H10K 59/124* (2023.02); *H10K 71/00* (2023.02); *H10K 59/1201* (2023.02)

(58) Field of Classification Search
  CPC .............. H10K 59/873; H10K 59/124; H10K 59/1201; H10K 71/00

USPC ......................................... 257/40, 59, 72, 99
See application file for complete search history.

(56) References Cited

U.S. PATENT DOCUMENTS

| | | | |
|---|---|---|---|
| 6,734,391 B2 | 5/2004 | Jeon | |
| 10,720,604 B2 | 7/2020 | Kim et al. | |
| 10,777,620 B2 | 9/2020 | Won et al. | |
| 10,854,846 B2 | 12/2020 | Kim et al. | |
| 11,061,505 B2 | 7/2021 | Jang et al. | |
| 11,315,998 B2 | 4/2022 | Han et al. | |
| 2019/0355930 A1* | 11/2019 | Lee | H10K 59/121 |
| 2020/0035946 A1* | 1/2020 | Cheng | H10K 59/8722 |
| 2020/0136087 A1* | 4/2020 | Kim | H10K 59/122 |

FOREIGN PATENT DOCUMENTS

| | | |
|---|---|---|
| KR | 10-0786179 B1 | 12/2007 |
| KR | 10-2018-0131011 A | 12/2018 |
| KR | 10-2020-0047941 A | 5/2020 |
| KR | 10-2020-0053911 A | 5/2020 |
| KR | 10-2020-0082566 A | 7/2020 |
| KR | 10-2020-0142631 A | 12/2020 |

\* cited by examiner

*Primary Examiner* — Eric W Jones
(74) *Attorney, Agent, or Firm* — Innovation Counsel LLP

(57) ABSTRACT

A display apparatus includes a substrate, a thin-film transistor, an insulating material stack, and a first dam structure. The substrate includes a display area and a peripheral area located outside the display area. The thin-film transistor layer overlaps the substrate. The insulating material stack overlaps the peripheral area. The first dam structure overlaps the substrate, is located closer to the display area than the insulating material stack, partially covers the insulating material stack, and reaches farther than the insulating material stack with reference to the substrate.

7 Claims, 16 Drawing Sheets

FIG. 1

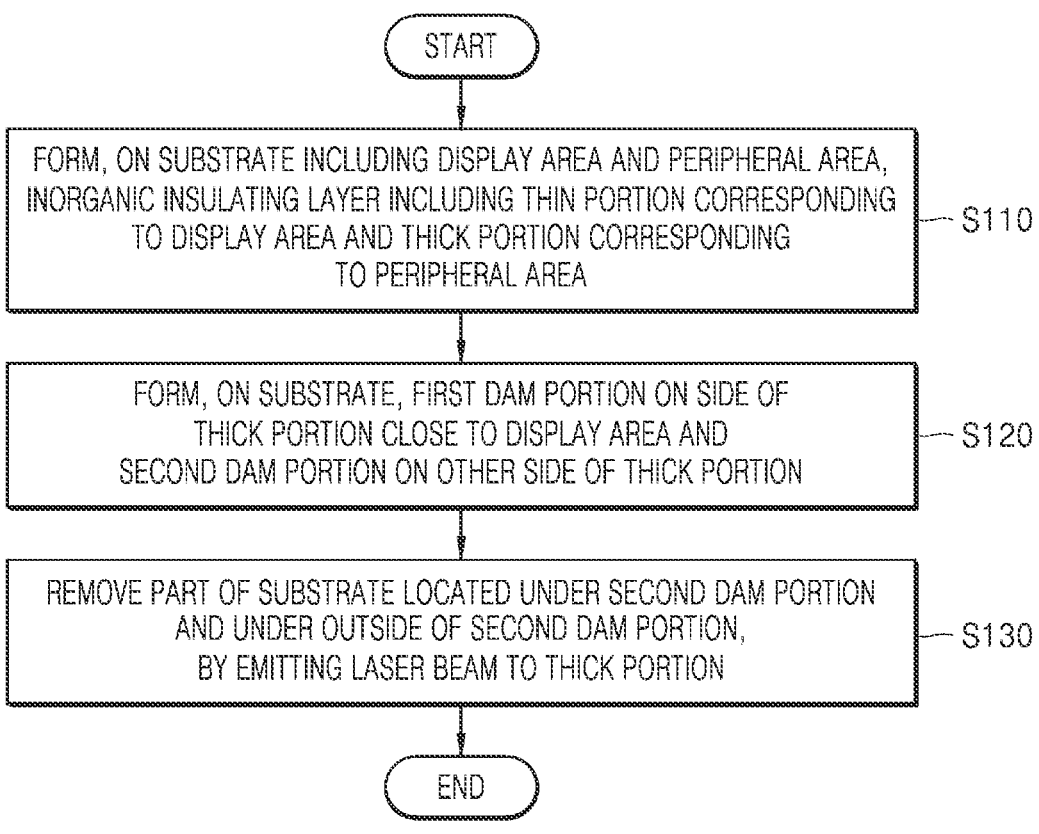

START

FORM, ON SUBSTRATE INCLUDING DISPLAY AREA AND PERIPHERAL AREA, INORGANIC INSULATING LAYER INCLUDING THIN PORTION CORRESPONDING TO DISPLAY AREA AND THICK PORTION CORRESPONDING TO PERIPHERAL AREA —— S110

FORM, ON SUBSTRATE, FIRST DAM PORTION ON SIDE OF THICK PORTION CLOSE TO DISPLAY AREA AND SECOND DAM PORTION ON OTHER SIDE OF THICK PORTION —— S120

REMOVE PART OF SUBSTRATE LOCATED UNDER SECOND DAM PORTION AND UNDER OUTSIDE OF SECOND DAM PORTION, BY EMITTING LASER BEAM TO THICK PORTION —— S130

END

DISPLAY APPARATUS HAVING DAM STRUCTURES AND AN INSULATING MATERIAL AND METHOD OF MANUFACTURING THE SAME

CROSS-REFERENCE TO RELATED APPLICATION

This application claims priority under 35 U.S.C. § 119 to Korean Patent Application No. 10-2021-0136898 filed on Oct. 14, 2021 in the Korean Intellectual Property Office; the Korean Patent Application is incorporated by reference.

BACKGROUND

1. Field

The technical field relates to a display apparatus and a method for manufacturing the display apparatus.

2. Description of the Related Art

In general, components of a display apparatus are formed on a substrate. The display apparatus is manufactured by cutting the substrate according to a desired shape of the display apparatus. In a process of cutting a substrate, cracks may occur in the display apparatus, and/or some elements of the display apparatus may be carbonized. As a result, the quality and/or performance of the display apparatus may be unsatisfactory.

SUMMARY

One or more embodiments may be related to a display apparatus with minimum defects that are introduced during substrate cutting in a manufacturing process of the display apparatus. One or more embodiments may be related to a method for manufacturing the display apparatus.

According to one or more embodiments, a display apparatus includes a substrate including a display area and a peripheral area located outside the display area, a thin-film transistor layer located on the substrate, a residual film control dam located on the substrate and outside the display area, and a first dam structure located on the substrate and between the residual film control dam and the display area, covering a part of the residual film control dam, and having a height greater than a height of the residual film control dam.

The thin-film transistor layer may include a first semiconductor layer located on the substrate, a first gate insulating layer covering the first semiconductor layer, and a first gate layer located on the first gate insulating layer.

The residual film control dam may include a first inorganic insulating layer including a same material as a material of the first gate insulating layer, wherein a thickness of the first inorganic insulating layer is thicker than a thickness of the first gate insulating layer.

The first inorganic insulating layer may be integrally formed with the first gate insulating layer.

The thin-film transistor layer may further include a first interlayer insulating layer covering the first gate layer.

The residual film control dam may include a second inorganic insulating layer including a same material as a material of the first interlayer insulating layer, wherein a thickness of the second inorganic insulating layer is thicker than a thickness of the first interlayer insulating layer.

The second inorganic insulating layer may be integrally formed with the first interlayer insulating layer.

The thin-film transistor layer may further include a conductive layer located on the first interlayer insulating layer, and a second interlayer insulating layer covering the conductive layer.

The residual film control dam may include a third inorganic insulating layer including a same material as a material of the second interlayer insulating layer, wherein a thickness of the third inorganic insulating layer is thicker than a thickness of the second interlayer insulating layer.

The third inorganic insulating layer may be integrally formed with the second interlayer insulating layer.

The thin-film transistor layer may further include a second semiconductor layer located on the second interlayer insulating layer, a second gate insulating layer covering the second semiconductor layer, and a second gate layer located on the second gate insulating layer.

The residual film control dam may include a fourth inorganic insulating layer including a same material as a material of the second gate insulating layer, wherein a thickness of the fourth insulating layer is thicker than a thickness of the second gate insulating layer.

The fourth inorganic insulating layer may be integrally formed with the second gate insulating layer.

The thin-film transistor layer may further include a third interlayer insulating layer covering the second gate layer.

The residual film control dam may include a fifth inorganic insulating layer including a same material as a material of the third interlayer insulating layer, wherein a thickness of the fifth inorganic insulating layer is thicker than a thickness of the third interlayer insulating layer.

The fifth inorganic insulating layer may be integrally formed with the third interlayer insulating layer.

The residual film control dam may include a first inorganic insulating layer including a same material as a material of the first gate insulating layer, a second inorganic insulating layer including a same material as a material of the first interlayer insulating layer, a third inorganic insulating layer including a same material as a material of the second interlayer insulating layer, a fourth inorganic insulating layer including a same material as a material of the second gate insulating layer, and a fifth inorganic insulating layer including a same material as a material of the third interlayer insulating layer, wherein a sum of thicknesses of the first inorganic insulating layer through the fifth inorganic insulating layer is greater than a sum of thicknesses of the first gate insulating layer, the first interlayer insulating layer, the second interlayer insulating layer, the second gate insulating layer, and the third interlayer insulating layer.

The first inorganic insulating layer may be integrally formed with the first gate insulating layer, the second inorganic insulating layer may be integrally formed with the first interlayer insulating layer, the third inorganic insulating layer may be integrally formed with the second interlayer insulating layer, the fourth inorganic insulating layer may be integrally formed with the second gate insulating layer, and the fifth inorganic insulating layer may be integrally formed with the third interlayer insulating layer.

The residual film control dam may have a top surface including at least one groove extending along an outer side of the display area.

The residual film control dam may surround the display area.

When viewed in a direction perpendicular to the substrate, the display area may include a corner portion, and the residual film control dam extends along the corner portion.

According to one or more embodiments, a method of manufacturing a display apparatus includes forming, on a substrate including a display area and a peripheral area, an inorganic insulating layer including a thin portion corresponding to the display area and a thick portion corresponding to the peripheral area, forming, on the substrate, a first dam structure on a side of the thick portion close to the display area and a second dam structure on the other side of the thick portion, and removing a part of the substrate located under the second dam structure and under the outside of the second dam structure, by emitting a laser beam to the thick portion.

The method may further include forming a first semiconductor layer on the substrate, wherein the forming of the inorganic insulating layer includes forming the inorganic insulating layer covering the first semiconductor layer.

The method may further include forming a first semiconductor layer on the substrate, and forming a first gate layer on the first semiconductor layer, wherein the forming of the inorganic insulating layer includes forming the inorganic insulating layer covering the first gate layer.

The method may further include forming a first semiconductor layer on the substrate, forming a first gate layer on the first semiconductor layer, and forming a conductive layer on the first gate layer, wherein the forming of the inorganic insulating layer includes forming the inorganic insulating layer covering the conductive layer.

The method may further include forming a first semiconductor layer on the substrate, forming a first gate layer on the first semiconductor layer, forming a conductive layer on the first gate layer, and forming a second semiconductor layer on the conductive layer, wherein the forming of the inorganic insulating layer includes forming the inorganic insulating layer covering the second semiconductor layer.

The method may further include forming a first semiconductor layer on the substrate, forming a first gate layer on the first semiconductor layer, forming a conductive layer on the first gate layer, forming a second semiconductor layer on the conductive layer, and forming a second gate layer on the second semiconductor layer, wherein the forming of the inorganic insulating layer includes forming the inorganic insulating layer covering the second gate layer.

The method may further include forming a first semiconductor layer on the substrate, forming a first gate layer on the first semiconductor layer, forming a conductive layer on the first gate layer, forming a second semiconductor layer on the conductive layer, and forming a second gate layer on the second semiconductor layer, wherein the forming of the inorganic insulating layer includes forming a first inorganic insulating layer covering the first semiconductor layer, forming a second inorganic insulating layer covering the first gate layer, forming a third inorganic insulating layer covering the conductive layer, forming a fourth inorganic insulating layer covering the second semiconductor layer, and forming a fifth inorganic insulating layer covering the second gate layer.

An embodiment may be related to a display apparatus. The display apparatus may include a substrate, a thin-film transistor, an insulating material stack, and a first dam structure. The substrate may include a display area and a peripheral area located outside the display area. The thin-film transistor layer may overlap the substrate. The insulating material stack may overlap the peripheral area. The first dam structure may overlap the substrate, may be located closer to the display area than the insulating material stack, may partially cover the insulating material stack, and may reach farther than the insulating material stack with reference to the substrate.

The thin-film transistor may include the following elements: a first semiconductor layer overlapping the substrate; a first gate insulating layer covering the first semiconductor layer; and a first gate layer located on the first gate insulating layer.

The insulating material stack may include a first inorganic insulating layer including a material identical to a material of the first gate insulating layer. The first inorganic insulating layer may be thicker than the first gate insulating layer in a direction perpendicular to the substrate.

The first inorganic insulating layer may be integrally formed with the first gate insulating layer.

The thin-film transistor layer may include a first interlayer insulating layer covering the first gate layer.

The insulating material stack may include a second inorganic insulating layer including a material identical to a material of the first interlayer insulating layer. The second inorganic insulating layer may be thicker than the first interlayer insulating layer in a direction perpendicular to the substrate.

The second inorganic insulating layer may be integrally formed with the first interlayer insulating layer.

The thin-film transistor layer may include the following elements: a conductive layer located on the first interlayer insulating layer; and a second interlayer insulating layer covering the conductive layer.

The insulating material stack may include a third inorganic insulating layer including a material identical to a material of the second interlayer insulating layer. The third inorganic insulating layer may be thicker than the second interlayer insulating layer in a direction perpendicular to the substrate.

The third inorganic insulating layer may be integrally formed with the second interlayer insulating layer.

The thin-film transistor layer may include the following elements: a second semiconductor layer located on the second interlayer insulating layer; a second gate insulating layer covering the second semiconductor layer; and a second gate layer located on the second gate insulating layer.

The insulating material stack may include a fourth inorganic insulating layer including a material identical to a material of the second gate insulating layer. The fourth insulating layer may be thicker than the second gate insulating layer in a direction perpendicular to the substrate.

The fourth inorganic insulating layer may be integrally formed with the second gate insulating layer.

The thin-film transistor layer may include a third interlayer insulating layer covering the second gate layer.

The insulating material stack may include a fifth inorganic insulating layer including a material identical to a material of the third interlayer insulating layer. The fifth inorganic insulating layer may be thicker than the third interlayer insulating layer in a direction perpendicular to the substrate.

The fifth inorganic insulating layer may be integrally formed with the third interlayer insulating layer.

The insulating material stack may include the following elements: a first inorganic insulating layer including a material identical to a material of the first gate insulating layer; a second inorganic insulating layer including a material identical to a material of the first interlayer insulating layer; a third inorganic insulating layer including a material identical to a material of the second interlayer insulating layer; a fourth inorganic insulating layer including a material identical to a material of the second gate insulating layer; and a fifth inorganic insulating layer including a material identical to a material of the third interlayer insulating layer. A sum of thicknesses of the first inorganic insulating layer,

5 the second inorganic insulating layer, the third inorganic insulating layer, the fourth inorganic insulating layer, and the fifth inorganic insulating layer in a direction perpendicular to the substrate may be greater than a sum of thicknesses of the first gate insulating layer, the first interlayer insulating layer, the second interlayer insulating layer, the second gate insulating layer, and the third interlayer insulating layer in the direction perpendicular to the substrate.

The first inorganic insulating layer may be integrally formed with the first gate insulating layer. The second inorganic insulating layer may be integrally formed with the first interlayer insulating layer. The third inorganic insulating layer may be integrally formed with the second interlayer insulating layer. The fourth inorganic insulating layer may be integrally formed with the second gate insulating layer. The fifth inorganic insulating layer may be integrally formed with the third interlayer insulating layer.

The display apparatus may include an encapsulation layer overlapping each of the thin film transistor, the first dam structure, and the insulating material stack. The insulating material stack may include at least one groove. The encapsulation layer may be partially positioned in the at least one groove.

The insulating material stack may surround the display area in a plan view of the display apparatus.

The display area may include a corner in a plan view of the display apparatus. The insulating material stack may extend along the corner in the plan view of the display apparatus.

An embodiment may be related to a method for manufacturing a display apparatus. The method may include the following steps: forming an inorganic insulating layer on a substrate, the substrate may include a display area and a peripheral area, the inorganic insulating layer including a first portion and a second portion, the first portion overlapping the display area, the second portion overlapping the peripheral area and being thicker than the first portion in a direction perpendicular to the substrate; forming a first dam structure and a second dam structure that overlap the substrate, the first dam structure being located closer to the display area than the second portion, the second portion being located closer to the display area than the second dam structure; and removing a part of the substrate overlapped by the second dam structure by emitting a laser beam to at least the second portion.

The method may include forming a first semiconductor layer that overlaps the substrate. The inorganic insulating layer may cover the first semiconductor layer.

The method may include the following steps: forming a first semiconductor layer that overlaps the substrate; and forming a first gate layer that overlaps the first semiconductor layer. The inorganic insulating layer may cover the first gate layer.

The method may include the following steps: forming a first semiconductor layer that overlaps the substrate; forming a first gate layer that overlaps the first semiconductor layer; and forming a conductive layer that overlaps the first gate layer. The inorganic insulating layer may cover the conductive layer.

The method may include the following steps: forming a first semiconductor layer that overlaps the substrate; forming a first gate layer that overlaps the first semiconductor layer; forming a conductive layer that overlaps the first gate layer; and forming a second semiconductor layer that overlaps the conductive layer. The inorganic insulating layer may cover the second semiconductor layer.

6

The method may include the following steps: forming a first semiconductor layer that overlaps the substrate; forming a first gate layer that overlaps the first semiconductor layer; forming a conductive layer that overlaps the first gate layer; forming a second semiconductor layer that overlaps the conductive layer; and forming a second gate layer that overlaps the second semiconductor layer. The inorganic insulating layer may cover the second gate layer.

The method may include the following steps: forming a first semiconductor layer that overlaps the substrate; forming a first gate layer that overlaps the first semiconductor layer; forming a conductive layer that overlaps the first gate layer; forming a second semiconductor layer that overlaps the conductive layer; and forming a second gate layer that overlaps the second semiconductor layer. The forming of the inorganic insulating layer may include the following steps: forming a first inorganic insulating layer covering the first semiconductor layer; forming a second inorganic insulating layer covering the first gate layer; forming a third inorganic insulating layer covering the conductive layer; forming a fourth inorganic insulating layer covering the second semiconductor layer; and forming a fifth inorganic insulating layer covering the second gate layer.

BRIEF DESCRIPTION OF THE DRAWINGS

FIG. 1 is a flowchart illustrating a method for manufacturing a display apparatus according to an embodiment.

DETAILED DESCRIPTION

Figure 2:
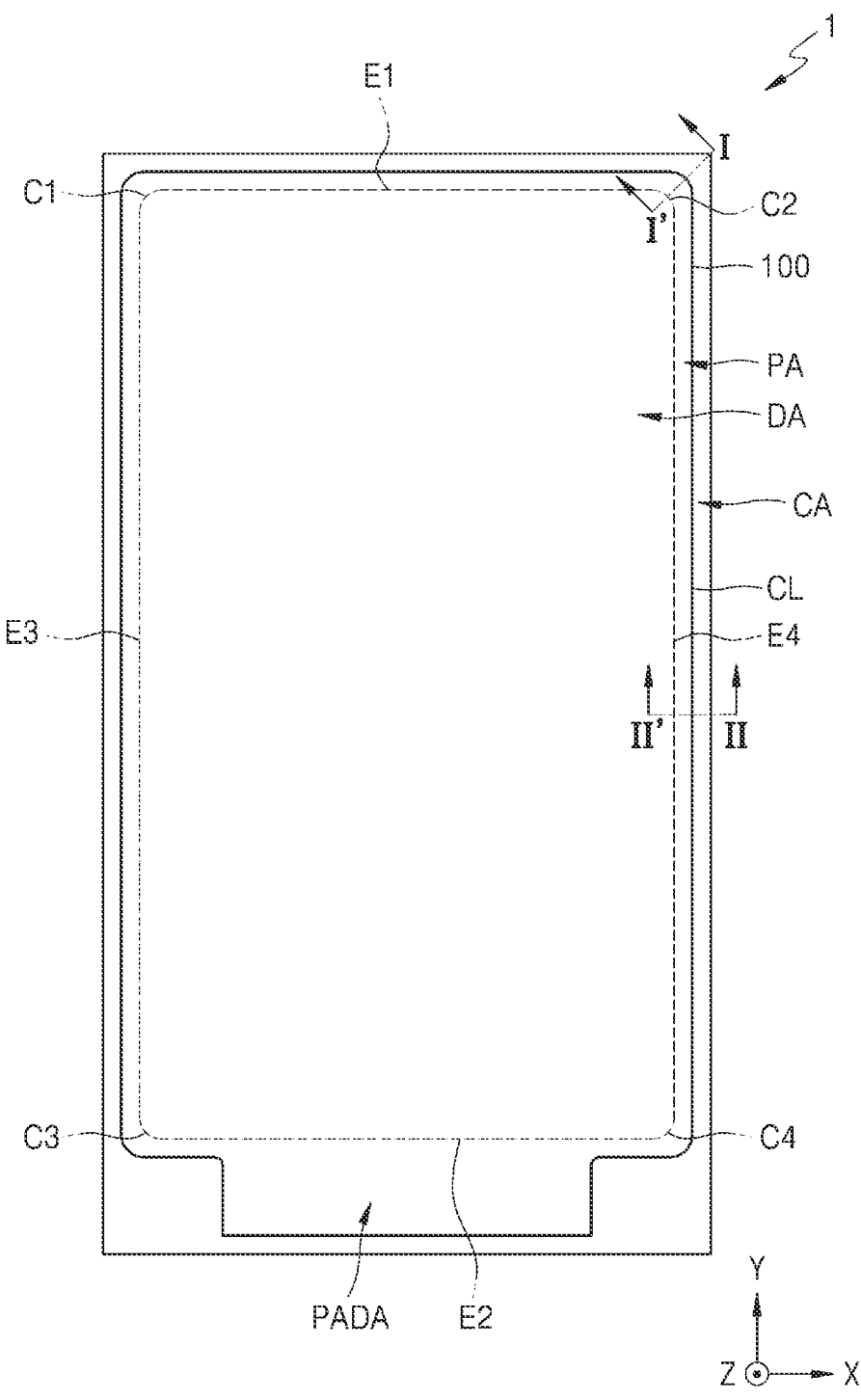
FIG. 2 is a plan view illustrating a display apparatus being manufactured according to an embodiment.

Examples of embodiments are described with reference to the accompanying drawings, In the drawings, like reference numerals may refer to like elements. Practical embodiments may have different forms and should not be construed as being limited to the described examples.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element may be directly on the second element, or one or more intervening elements may be present between the first element and the second element.

Dimensions in the drawings may be exaggerated or contracted for convenience of explanation. The disclosure is not limited to the illustrated dimensions.

The X-axis, the Y-axis, and the Z-axis may be or may not be perpendicular to one another.

The singular forms "a," "an," and "the" may indicate the plural forms as well, unless the context clearly indicates otherwise.

The terms "comprise" and/or "include" may specify the presence of stated features or components, but may not preclude the presence or addition of one or more other features or components.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "include" or "comprise" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. The term "residual film control dam" may mean "residual film minimizing dam" and/or "insulating material stack." An element may mean a portion of the element; for example, the first inter-layer insulating layer may mean a portion of the first interlayer insulating layer. A thickness may be in a direction perpendicular to a substrate. A height may be with reference to a substrate.

Figure 3:
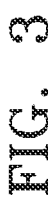
FIG. 3 is a cross-sectional view taken along line I-I' of FIG. 2 according to an embodiment.

FIG. 1 is a flowchart illustrating a method for manufacturing a display apparatus according to an embodiment. FIG. 2 is a plan view illustrating a display apparatus 1 being manufactured according to an embodiment. FIG. 3 is a cross-sectional view taken along line I-I' of FIG. 2 according to an embodiment.

In operation/step S110 (shown in FIG. 1), on a substrate 100 including a display area DA and a peripheral area PA, an inorganic insulating layer including a thin portion corresponding to the display area DA and a thick portion corresponding to the peripheral area PA may be formed. Other processes may be performed before the inorganic insulating layer is formed. For example, a process of forming a buffer layer 111 on an entire face of the substrate 100 may be performed. A shielding layer 200 may be formed to protect a first semiconductor layer 210, and an insulating layer 112 may be formed to cover the shielding layer 200.

The substrate 100 may include one or more flexible or bendable materials. For example, the substrate 100 may include glass, a metal, or a polymer resin. The substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layer structure including two layers each including a polymer resin and may have a barrier layer including an inorganic material (e.g., silicon oxide, silicon nitride, or silicon oxynitride) and located between the two layers.

As shown in FIG. 2, the substrate 100 may include the display area DA, the peripheral area PA outside the display area DA, and a cutting area CA outside the peripheral area PA. The display area DA may have a substantially rectangular or square shape. The display area DA may have rounded/curved corners. The display area DA may include a first edge portion E1 and a second edge portion E2 facing each other and extending in a Y-axis direction. The display area DA may include a third edge portion E3 and a fourth edge portion E4 facing each other, extending in an X-axis direction, and located between the first edge portion E1 and the second edge portion E2. A pad area PADA may be adjacent to the second edge portion E2. The first edge portion E1 and the third edge portion E3 may be connected to each other through a first corner portion C1, and the first corner portion C1 may have a rounded shape. The first edge portion E1 may be connected to the fourth edge portion E4 through a second corner portion C2, the second edge portion E2 may be connected to the third edge portion E3 through a third corner portion C3, and the second edge portion E2 may be connected to the fourth edge portion E4 through a fourth corner portion C4. The second corner portion C2, the third corner portion C3, and the fourth corner portion C4 may also have rounded shapes.

An inorganic insulating layer may be formed on an entire face of the display area DA and the peripheral area PA of the substrate 100, and the inorganic insulating layer may include a plurality of inorganic insulating layers 113, 114, 115, 116, and 117. At least one of the inorganic insulating layers 113, 114, 115, 116, and 117 may include a thin portion and a thick portion thicker than the thin portion. FIG. 3 illustrates that each of the inorganic insulating layers 113, 114, 115, 116, and 117 includes a thin portion and a thick portion thicker than the thin portion. The thin portions of the inorganic insulating layers 113, 114, 115, 116, and 117 may overlap the display area DA. The thick portions of the inorganic insulating layers 113, 114, 115, 116, and 117 may overlap the peripheral area PA. The inorganic insulating layers 113, 114, 115, 116, and 117 each including the thin portion and the thick portion may be formed using a halftone mask.

As shown in FIG. 3, not only a display device 280 but also a thin-film transistor layer TFT to which the display device 280 is electrically connected may be located in the display area DA. In FIG. 3, an organic light-emitting device is located as the display device 280 in the display area DA. When the organic light-emitting device is electrically connected to the thin-film transistor layer TFT, it may mean that a pixel electrode 281 is electrically connected to the thin-film transistor layer TFT. When necessary, a thin-film transistor (not shown) may also be located in the peripheral area PA outside the display area DA. The thin-film transistor located in the peripheral area may be, for example, a part of a circuit unit for controlling an electrical signal applied to the display area DA.

The thin-film transistor layer TFT may include one or more of the first semiconductor layer 210, a first gate layer 220, a conductive layer 230, a second semiconductor layer 240, and a second gate layer 250. In order to ensure insulation between layers included in the thin-film transistor layer TFT, the thin-film transistor layer TFT may include one or more of the inorganic insulating layers 113, 114, 115, 116, and 117.

The first semiconductor layer 210 may be formed on the substrate 100, and the first gate layer 220 may be formed on the first semiconductor layer 210. In order to ensure insulation between the first semiconductor layer 210 and the first gate layer 220, the first gate insulating layer 113 covering the first semiconductor layer 210 may be formed between the first semiconductor layer 210 and the first gate layer 220.

The first semiconductor layer 210 may include a silicon semiconductor. The first semiconductor layer 210 may include amorphous silicon or polysilicon. The first semiconductor layer 210 may include polysilicon crystalized at a low temperature. When necessary, ions may be implanted into at least a part of the first semiconductor layer 210.

The first gate layer 220 may include a metal, an alloy, a conductive metal oxide, or a transparent conductive material. For example, the first gate layer 220 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first gate layer 220 may have a multi-layer structure, for example, a two-layer structure including Mo—Al, or a three-layer structure including Mo—Al—Mo.

The first gate insulating layer 113 may be an inorganic insulating layer including an inorganic material such as silicon oxide, silicon nitride, and/or silicon oxynitride. The first gate insulating layer 113 may be one thin portion of one of the above-mentioned inorganic insulating layers. The first gate insulating layer 113 may be formed by chemical vapor deposition (CVD) or atomic-layer deposition (ALD). This applies to various embodiments and modifications.

The first interlayer insulating layer 114 may be formed on the first gate layer 220 to cover the first gate layer 220. The first interlayer insulating layer 114 may be an inorganic insulating layer including an inorganic material such as silicon oxide, silicon nitride, and/or silicon oxynitride. The first interlayer insulating layer 114 may be a thin portion of one of the above-mentioned inorganic insulating layers. The first interlayer insulating layer 114 may be formed by CVD or ALD. This applies to various embodiments and modifications.

The conductive layer 230 may be formed on the first interlayer insulating layer 114, and the second interlayer insulating layer 115 may cover the conductive layer 230. The second interlayer insulating layer 115 may be an inorganic insulating layer including an inorganic material such as silicon oxide, silicon nitride, and/or silicon oxynitride. The second interlayer insulating layer 115 may be a thin portion of one of the above-mentioned inorganic insulating layers. The second interlayer insulating layer 115 may be formed by using CVD or ALD. This applies to various embodiments and modifications.

The conductive layer 230 may include a metal, an alloy, a conductive metal oxide, or a transparent conductive material. For example, the conductive layer 230 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The conductive layer 230 may have a multi-layer structure, for example, a two-layer structure including Mo—Al, or a three-layer structure including Mo—Al—Mo.

The second semiconductor layer 240 may be formed on the conductive layer 230, and the second gate layer 250 may be formed on the second semiconductor layer 240. In order to ensure insulation between the second semiconductor layer 240 and the second gate layer 250, the second gate insulating layer 116 covering the second semiconductor layer 240 may be formed between the second semiconductor layer 240 and the second gate layer 250.

The second semiconductor layer 240 may include an oxide semiconductor, and the second gate layer 250 may include a metal, an alloy, a conductive metal oxide, or a transparent conductive material. For example, the second gate layer 250 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The second gate layer 250 may have a multi-layer structure, for example, a two-layer structure including Mo—Al, or a three-layer structure including Mo—Al—Mo.

The second gate insulating layer 116 may be an inorganic insulating layer including an inorganic material such as silicon oxide, silicon nitride, and/or silicon oxynitride. The second gate insulating layer 116 may be a thin portion of one of the above-mentioned inorganic insulating layers. The second gate insulating layer 116 may be formed by using CVD or ALD. This applies to various embodiments and modifications.

The third interlayer insulating layer 117 may cover the second gate layer 250. The third interlayer insulating layer 117 may be an inorganic insulating layer including an inorganic material such as silicon oxide, silicon nitride, and/or silicon oxynitride. The third interlayer insulating layer 117 may be a thin portion of one of the above-mentioned inorganic insulating layers. The third interlayer insulating layer 117 may be formed by using CVD or ALD. This applies to various embodiments and modifications.

Referring to FIG. 3, a residual film control dam 300 (or residual film minimizing dam 300) may be located on the peripheral area PA. The residual film control dam 300 may include inorganic insulating layers 310, 320, 330, 340, and 350. The first inorganic insulating layer 310 may be simultaneously and integrally formed with the first gate insulating layer 113 (included in the thin-film transistor layer TFT) using the same material. The first inorganic insulating layer 310 may be a thick portion of the first gate insulating layer 113. Because a thickness of the first gate insulating layer 113 is different from a thickness of the first inorganic insulating layer 310 (in a Z-axis direction perpendicular to the substrate 100), the first gate insulating layer 113 and the first inorganic insulating layer 310 may be formed using a halftone mask.

The second inorganic insulating layer 320 may be simultaneously and integrally formed with the first interlayer insulating layer 114 (included in the thin-film transistor layer TFT) using the same material. The second inorganic insulating layer 320 may be a thick portion of the first interlayer insulating layer 114. Because a thickness of the first interlayer insulating layer 114 is different from a thickness of the second inorganic insulating layer 320, the first interlayer insulating layer 114 and the second inorganic insulating layer 320 may be formed using a halftone mask. The third inorganic insulating layer 330 may be simultaneously and integrally formed with the second interlayer insulating layer 115 (included in the thin-film transistor layer TFT) using the same material. The third inorganic insulating layer 330 may be a thick portion of the second interlayer insulating layer 115. Because a thickness of the second interlayer insulating layer 115 is different from a thickness of the third inorganic insulating layer 330, the second interlayer insulating layer 115 and the third inorganic insulating layer 330 may be formed using a halftone mask.

The fourth inorganic insulating layer 340 may be simultaneously and integrally formed with the second gate insulating layer 116 (included in the thin-film transistor layer TFT) using the same material. The fourth inorganic insulating layer 340 may be a thick portion of the second gate insulating layer 116. Because a thickness of the second gate insulating layer 116 is different from a thickness of the fourth inorganic insulating layer 340, the second gate insulating layer 116 and the fourth inorganic insulating layer 340 may be formed using a halftone mask. The fifth inorganic insulating layer 350 may be simultaneously and integrally formed with the third interlayer insulating layer 117 (included in the thin-film transistor layer TFT) using the same material. The fifth inorganic insulating layer 350 may be a thick portion of the third interlayer insulating layer 117. Because a thickness of the third interlayer insulating layer 117 is different from a thickness of the fifth inorganic insulating layer 350, the third interlayer insulating layer 117 and the fifth inorganic insulating layer 350 may be formed using a halftone mask.

The residual film control dam 300 may completely or partially surround the display area DA in a plan view of the display apparatus. In areas adjacent to the first through fourth edge portions E1, E2, E3, and E4 of the display area DA, because a distance between the first dam structure 400 and the second dam structure 600 is small and because a first inorganic encapsulation layer 291 and a second inorganic encapsulation layer 293 cover the first dam structure 400 and the second dam structure 600, a valley between the first dam structure 400 and the second dam structure 600 may be shallower than that in areas adjacent to the first through fourth corner portions C1, C2, C3, and C4 of the display area DA.

Figure 4:
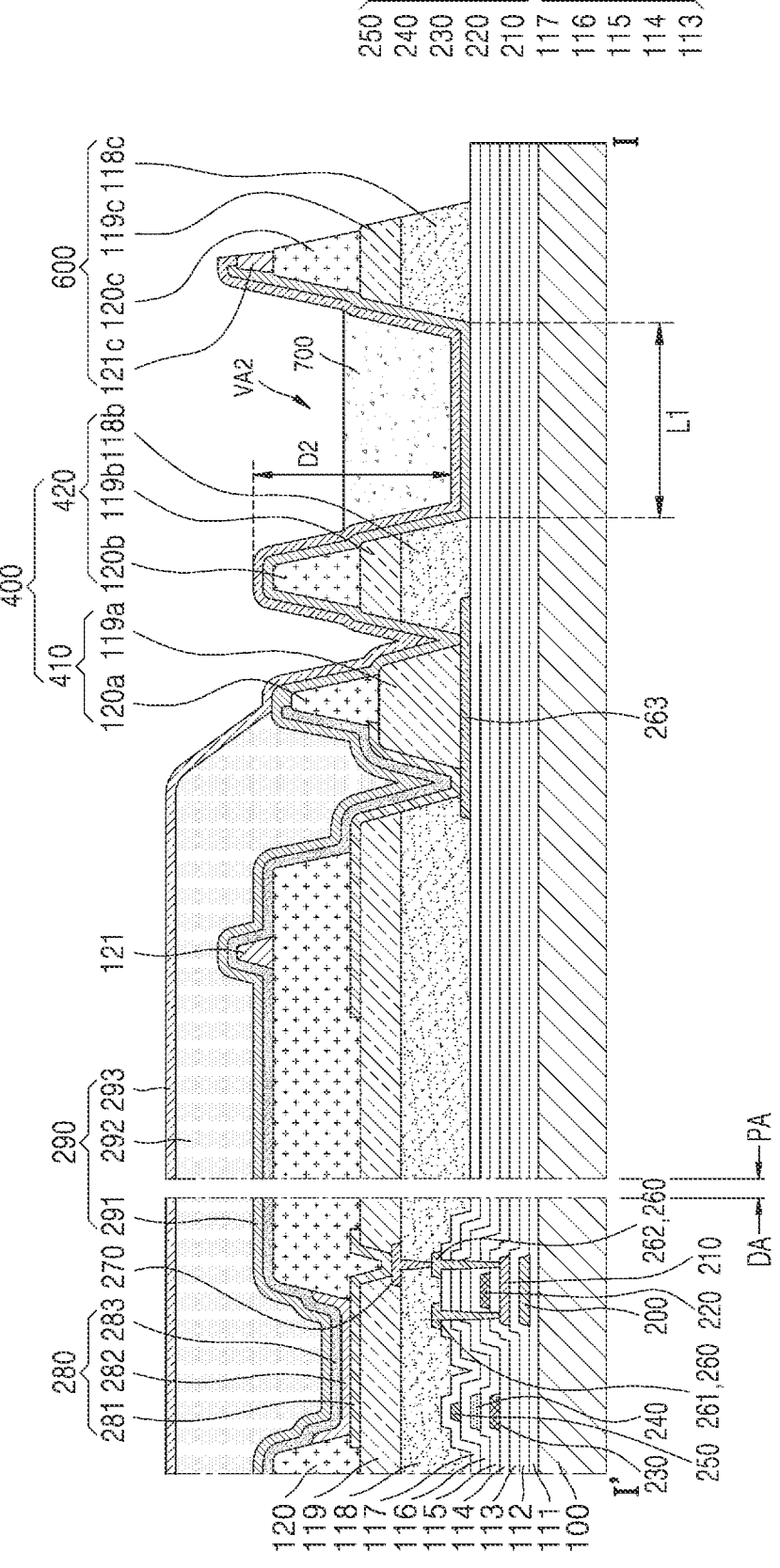
FIG. 4 is a cross-sectional view illustrating a structure formed in a method of manufacturing a display apparatus according to a comparative example.
Figure 5:
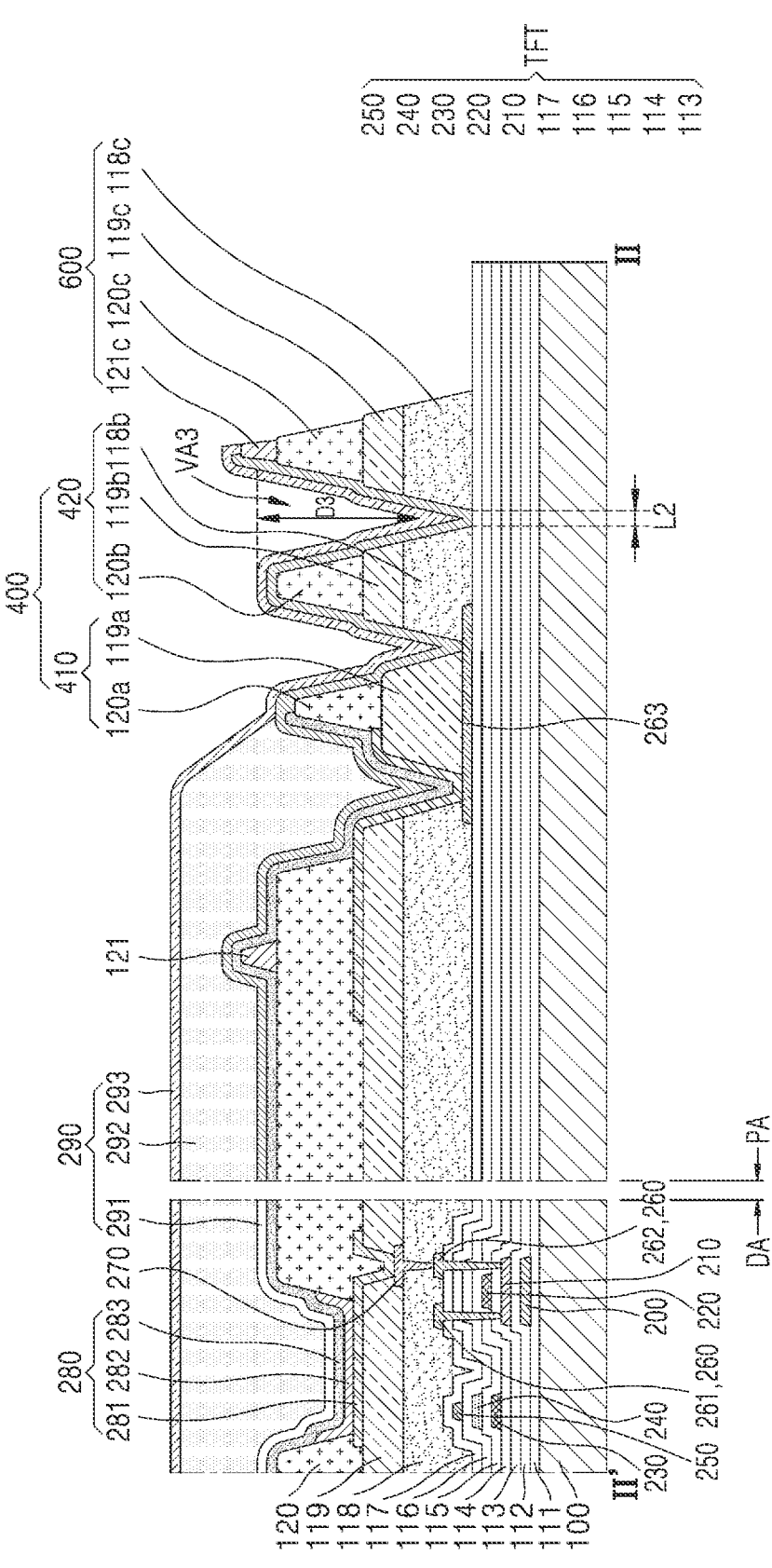
FIG. 5 is a cross-sectional view illustrating a structure formed in a method of manufacturing a display apparatus according to a comparative example.

FIG. 4 is a cross-sectional view illustrating a method of manufacturing a display apparatus according to a comparative example. Referring to FIG. 2 and FIG. 4, in areas adjacent to corner portions of the display area DA corresponding to line I-I' of FIG. 2, the second dam structure 600 is spaced from the first dam structure 400 by a first distance L1. Because the residual film control dam 300 is not formed, a second valley VA2 has a second depth D2. FIG. 5 is a cross-sectional view illustrating a method of manufacturing a display apparatus according to a comparative example. Referring to FIG. 2 and FIG. 5, in areas adjacent to edge portions of the display area DA corresponding to line II-II' of FIG. 2, the second dam structure 600 is spaced from the first dam structure 400 by a second distance L2 that is less than the first distance L1. Accordingly, even though the residual film control dam 300 is not formed, a third valley VA3 has a third depth D3 that is less than the second depth D2.

Accordingly, in embodiments, the residual film control dam 300 may be provided along the corner portions C1, C2, C3, and C4 to correspond to the corner portions C1, C2, C3, and C4 of the display area DA, and may not be provided along the edge portions E1, E2, E3, and E4 between the corner portions C1, C2, C3, and C4.

In operation/step S120 (shown in FIG. 1), the first dam structure 400 may be formed on the substrate 100 to be located closer to the display area DA than the residual film control dam 300 is, and the second dam structure 600 may be formed farther from the display area DA than the residual film control dam 300 is. The residual film control dam 300 includes the first inorganic insulating layer 310 through the fifth inorganic insulating layer 350 that are thick portions of the inorganic insulating layers 113, 114, 115, 116, and 117.

Referring to FIG. 3, a first connection electrode layer 260 including a source electrode 261 and a drain electrode 262 may be formed on the third interlayer insulating layer 117, and a first planarization layer 118 may cover the first connection electrode layer 260. The first planarization layer 118 may include an organic insulating material. For example, the first planarization layer 118 may include photoresist, benzocyclobutene (BCB), polyimide, hexamethyldisiloxane (HMDSO), polymethyl methacrylate (PMMA), polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend of some of the above materials.

A second connection electrode layer 270 may be formed on the first planarization layer 118, and a second planarization layer 119 may cover the second connection electrode layer 270. The second planarization layer 119 may include an organic insulating material. For example, the second planarization layer 119 may include photoresist, BCB, polyimide, HMDSO, PMMA, PS, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend of some of the above materials.

In the display area DA, an organic light-emitting device including the pixel electrode 281, a counter electrode 283, and an intermediate layer 282 (located between the pixel electrode 281 and the counter electrode 283 and including an emission layer) may be located on the second planarization layer 119. The pixel electrode 281 may contact one of the source electrode 261 and the drain electrode 262 through the first connection electrode layer 260 and the second connection electrode layer 270 and may be electrically connected to the thin-film transistor layer TFT, as shown in FIG. 3.

A pixel-defining film 120 may be formed on the second planarization layer 119. The pixel-defining film 120 defines a pixel by having an opening that exposes at least a central portion of the pixel electrode 281. The pixel-defining film 120 increases a distance between an edge of the pixel electrode 281 and the counter electrode 283 over the pixel electrode 281, to prevent an arc or the like from occurring on the edge of the pixel electrode 281. The pixel-defining film 120 may be formed of an organic material such as polyimide or HMDSO.

A spacer 121 may be formed on the pixel-defining film 120 of the peripheral area PA. The spacer 121 protrudes from the pixel-defining film 120 to an encapsulation layer 290, and may prevent damage to a mask or the like during a process. The spacer 121 may be formed of an organic material such as polyimide or HMDSO.

The intermediate layer 282 of the organic light-emitting device may include a low molecular weight material or a high molecular weight material. When the intermediate layer 282 includes a low molecular weight material, the intermediate layer 282 may have a single or stacked structure in which a hole injection layer (HIL), a hole transport layer (HTL), an emission layer (EML), an electron transport layer (ETL), and an electron injection layer (EIL) are stacked. Examples of the low molecular weight organic material may include organic materials such as copper phthalocyanine (CuPc), N,N'-Di(napthalene-1-yl)-N,N'-diphenyl-benzidine (NPB), and tris-8-hydroxyquinoline aluminum (Alq3). The above layers may be formed by vacuum deposition.

When the intermediate layer 282 includes a high molecular weight material, the intermediate layer 282 may have a structure including a hole transport layer (HTL) and an emission layer (EML). The HTL may include poly(3,4-ethylenedioxythiophene) (PEDOT), and the EML may include a polymer material such as a polyphenylene vinylene (PPV)-based material or a polyfluorene-based material. The intermediate layer 282 may be formed by screen printing, inkjet printing, laser-induced thermal imaging (LITI), or the like.

The intermediate layer 282 may have one or more other structures. The intermediate layer 282 may include a layer that is integrally formed over a plurality of pixel electrodes 281, or may include a layer that is patterned to correspond to each of a plurality of pixel electrodes 281.

The counter electrode 283 may cover the display area DA. The counter electrode 283 may be shared by a plurality of organic light-emitting devices and may overlap a plurality of pixel electrodes 281.

For protecting the organic light-emitting device from external moisture, oxygen, or the like, the encapsulation layer 290 may cover the organic light-emitting device. The encapsulation layer 290 may cover the display area DA and may extend beyond the display area DA. The encapsulation layer 290 may include the first inorganic encapsulation layer 291, an organic encapsulation layer 292, and the second inorganic encapsulation layer 293, as shown in FIG. 3.

The first inorganic encapsulation layer 291 may cover the counter electrode 283, and may include silicon oxide, silicon nitride, and/or silicon oxynitride. In embodiments, other layers such as a capping layer may be located between the first inorganic encapsulation layer 291 and the counter electrode 283. Because the first inorganic encapsulation layer 291 is formed along various underlying structures, a top surface of the first inorganic encapsulation layer 291 is not flat. The organic encapsulation layer 292 may cover the first inorganic encapsulation layer 291 and may have a substantially flat top surface that overlaps at least the display area DA. The organic encapsulation layer 292 may include at least one of polyethylene terephthalate, polyethylene naphthalate, polycarbonate, polyimide, polyethylene sulfonate, polyoxymethylene, polyarylate, and hexamethyldisiloxane. The second inorganic encapsulation layer 293 may cover the organic encapsulation layer 292, and may include silicon oxide, silicon nitride, and/or silicon oxynitride. An edge of the second inorganic encapsulation layer 293 located outside the display area DA may contact the first inorganic encapsulation layer 291, and thus the organic encapsulation layer 292 is prevented from being exposed to the outside.

Because the encapsulation layer 290 includes the multilayer structure of the first inorganic encapsulation layer 291, the organic encapsulation layer 292, and the second inorganic encapsulation layer 293, even when cracks occur in the encapsulation layer 290, the cracks may be stopped between the first inorganic encapsulation layer 291 and the organic encapsulation layer 292 or between the organic encapsulation layer 292 and the second inorganic encapsulation layer 293. Accordingly, the formation of a path through which external moisture or oxygen penetrates into the display area DA may be prevented or minimized.

The first dam structure 400 may overlap the peripheral area PA. The first dam structure 400 may cover at least a part of a power supply line 263, may be located on a side of the residual film control dam 300 close to the display area DA, and may surround the display area DA in a plan view of the display apparatus. The first dam structure 400 may include a first dam 410 close to the display area DA, and a second dam 420 substantially located between the first dam 410 and the residual film control dam 300.

The first dam 410 may be formed on the power supply line 263. The first dam 410 may have a stacked structure in which a first layer 119a and a second layer 120a are stacked. The first layer 119a and the second planarization layer 119 may be simultaneously formed using the same material, and the second layer 120a and the pixel-defining film 120 may be simultaneously formed using the same material. Because the first layer 119a (directly contacting a top surface of the power supply line 263) is formed of an organic material having a higher adhesive force to a metal than an inorganic material, the first dam 410 may be stably formed on the power supply line 263. The first dam 410 may include a different material and may have a different height.

The second dam 420 may be formed outside the first dam 410 and may cover an end of the power supply line 263. The second dam 420 may have a stacked structure in which a first layer 118b, a second layer 119b, and a third layer 120b are stacked. The first layer 118b and the first planarization layer 118 may be simultaneously formed using the same material, the second layer 119b and the second planarization layer 119 may be simultaneously formed using the same material, and the third layer 120b and the pixel-defining film 120 may be simultaneously formed using the same material. A height of the second dam 420 may be greater than a height of the first dam 410 with reference to the substrate 100.

Because the first layer 118b of the second dam 420 covers an end portion of the power supply line 263, damage to the power supply line 263 may be prevented in a backplane manufacturing process using heat or chemicals. The second dam 420 may prevent or minimize leakage of a material used for forming the organic encapsulation layer 292 to the outside of the first dam structure 400 in a process of forming the organic encapsulation layer 292. Because the second dam 420 is higher than the first dam 410 and is sufficiently high with reference to the substrate 100, in a manufacturing process of forming the encapsulation layer 290 using a metal mask (not shown), the second dam 420 may prevent damage to a surface of the counter electrode 283 when the metal mask contacts the surface of the counter electrode 283.

Although the first dam structure 400 includes the first dam 410 and the second dam 420, that is, two dams in FIG. 3, the number, height(s), material, etc. of the dam(s) may be modified in various embodiments.

The second dam structure 600 may overlap the peripheral area PA. The second dam structure 600 may be substantially located between the residual film control dam 300 and an end of the substrate 100 and may surround the display area DA in a plan view of the display apparatus. The second dam structure 600 may have a stacked structure in which a first layer 118c, a second layer 119c, a third layer 120c, and a fourth layer 121c are stacked. The first layer 118c and the first planarization layer 118 may be simultaneously formed using the same material. The second layer 119c and the second planarization layer 119 may be simultaneously formed using the same material. The third layer 120c and the pixel-defining film 120 may be simultaneously formed using the same material. The fourth layer 121c and the spacer 121 may be simultaneously formed using the same material. A height of the second dam structure 600 may be greater than a height of the first dam structure 400 with reference to the substrate 100.

A first valley VA1 between the first dam structure 400 and the second dam structure 600 may be formed in the peripheral area PA, because the first dam structure 400 and the second dam structure 600 are higher than areas adjacent to the first dam structure 400 and the second dam structure 600.

A touch sensor layer (not shown) for a touchscreen function may be formed on the encapsulation layer 290. The touch sensor layer may include an inorganic film and/or an organic film. The inorganic film and/or the organic film included in the touch sensor layer may be formed on the entire face of the display area DA and the peripheral area PA, and a portion of the inorganic film and/or a portion of the organic film formed on the peripheral area PA may be removed by dry etching or wet etching.

Referring to FIG. 4, when the residual film control dam 300 is not formed, the second valley VA2 formed between the first dam structure 400 and the second dam structure 600 on the peripheral area PA has the second depth D2 considerably deep from a top surface of the first dam structure 400. Accordingly, when the portion(s) of the inorganic film and/or the organic film formed on the peripheral area PA is/are removed by dry etching or wet etching, a part of the inorganic film and/or the organic film formed in the second valley VA2 may not be removed. As shown in FIG. 4, a residual film 700 not removed in the second valley VA2 may remain.

Referring to FIG. 3, the residual film control dam 300 is formed between the first dam structure 400 and the second dam structure 600. Accordingly, the first valley VA1 having a first depth D1 less than the second depth D2 is formed on the peripheral area PA. Advantageously, through dry etching or wet etching, the inorganic film and/or the organic film formed in the sufficiently shallow first valley VA1 may be completely removed or a thickness of an unwanted residual film may be minimized.

In operation/step S130 (shown in FIG. 1), the substrate 100 may be cut, by emitting a laser beam to the substrate 100. As a result, a part of the substrate 100 overlapped by the second dam structure 600 and extending beyond the second dam structure 600 may be removed. Referring to FIG. 2 and FIG. 3, the cutting area CA of the display apparatus 1 (including the second dam structure 600 and the part of the substrate 100 overlapped by the second dam structure 600 and extending beyond the second dam structure 600) may be removed, by emitting a laser beam to the first valley VA1 formed on the peripheral area PA. The laser beam may be emitted to the substrate 100 along a cutting line CL. After the cutting area CA has been removed from the display apparatus 1, the display apparatus 2 (shown in FIG. 13A) having a desired shape may be manufactured.

In order to prevent cracks from growing in an undesired direction in a process of cutting a part of the substrate 100, a part of the substrate 100 may be cut by emitting a laser beam to a valley located between dams. However, referring to FIG. 4, if the residual film 700 having a considerable thickness and including an organic material remains in the second valley VA2, the residual film 700 may be carbonized by the laser beam and may cause defects. According to embodiments, the residual film 700 does not significantly remain in the first valley VA1. Advantageously, defects may be prevented or minimized in a process of cutting the substrate 100.

The residual film control dam 300 may include one or more of the first inorganic insulating layer 310, the second inorganic insulating layer 320, the third inorganic insulating layer 330, the fourth inorganic insulating layer 340, and the fifth inorganic insulating layer 350 shown in FIG. 3. For example, the residual film control dam 300 may include only one of the first inorganic insulating layer 310, the second inorganic insulating layer 320, the third inorganic insulating layer 330, the fourth inorganic insulating layer 340, and the fifth inorganic insulating layer 350.

Figure 6:
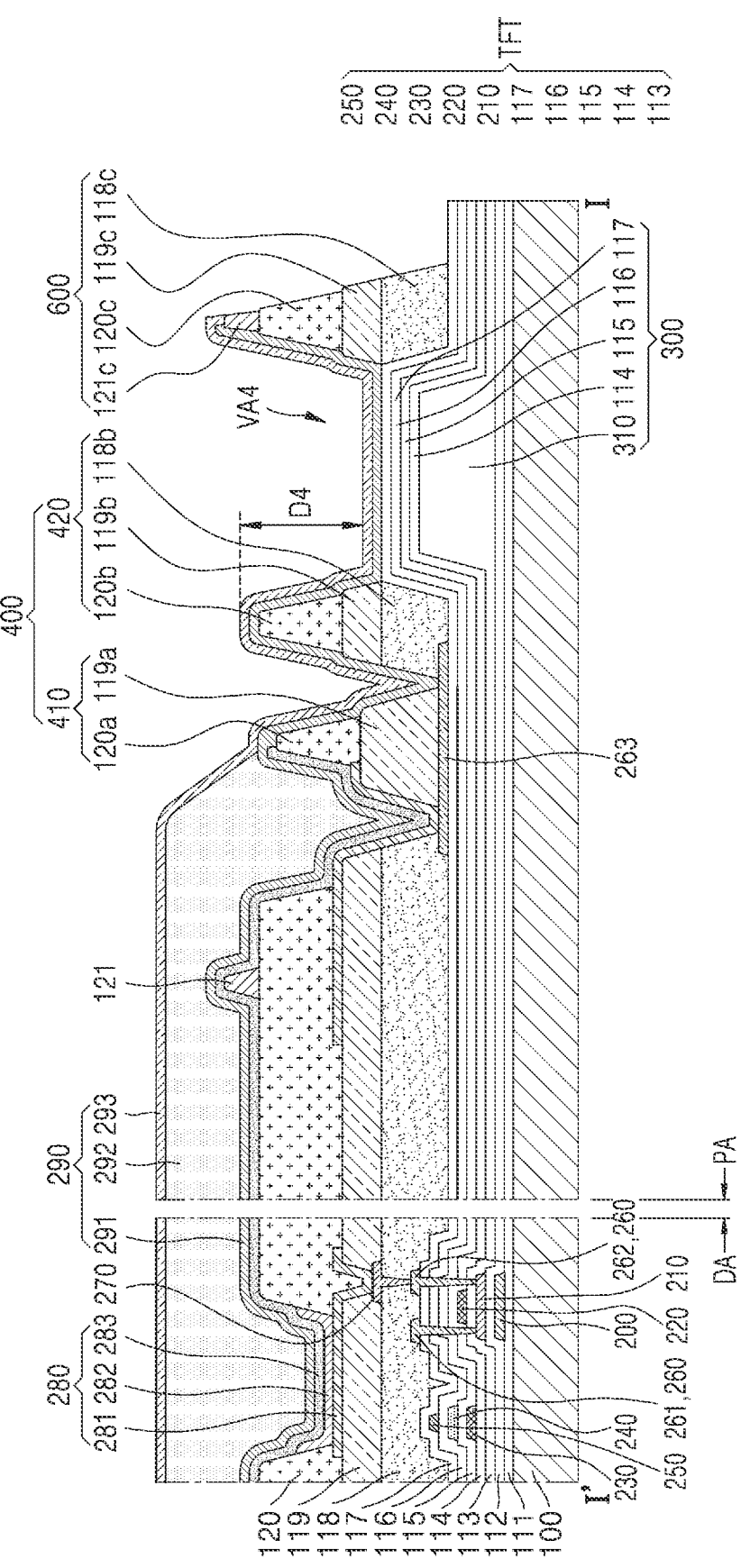
FIG. 6 is a cross-sectional view illustrating a portion of a display apparatus being manufactured according to an embodiment.

FIG. 6 is a cross-sectional view illustrating the display apparatus 1 being manufactured according to an embodiment. Referring to FIG. 6, the residual film control dam 300 may include (a portion of) the first inorganic insulating layer 310, the first interlayer insulating layer 114, the second interlayer insulating layer 115, the second gate insulating layer 116, and the third interlayer insulating layer 117. The first inorganic insulating layer 310 may be a thick portion of the first gate insulating layer 113. Thicknesses of the first interlayer insulating layer 114, the second interlayer insulating layer 115, the second gate insulating layer 116, and the third interlayer insulating layer 117 in the residual film control dam 300 may be the same as those in the display area DA. Because the first inorganic insulating layer 310 is sufficiently thick, a fourth depth D4 of a fourth valley VA4 may be less than the second depth D2 of the second valley VA2 illustrated in FIG. 4. Accordingly, like in the first valley VA1, the residual film 700 does not significantly remain in the valley VA4. Advantageously, defects may be prevented or minimized from occurring in a process of cutting the substrate 100.

Figure 7:
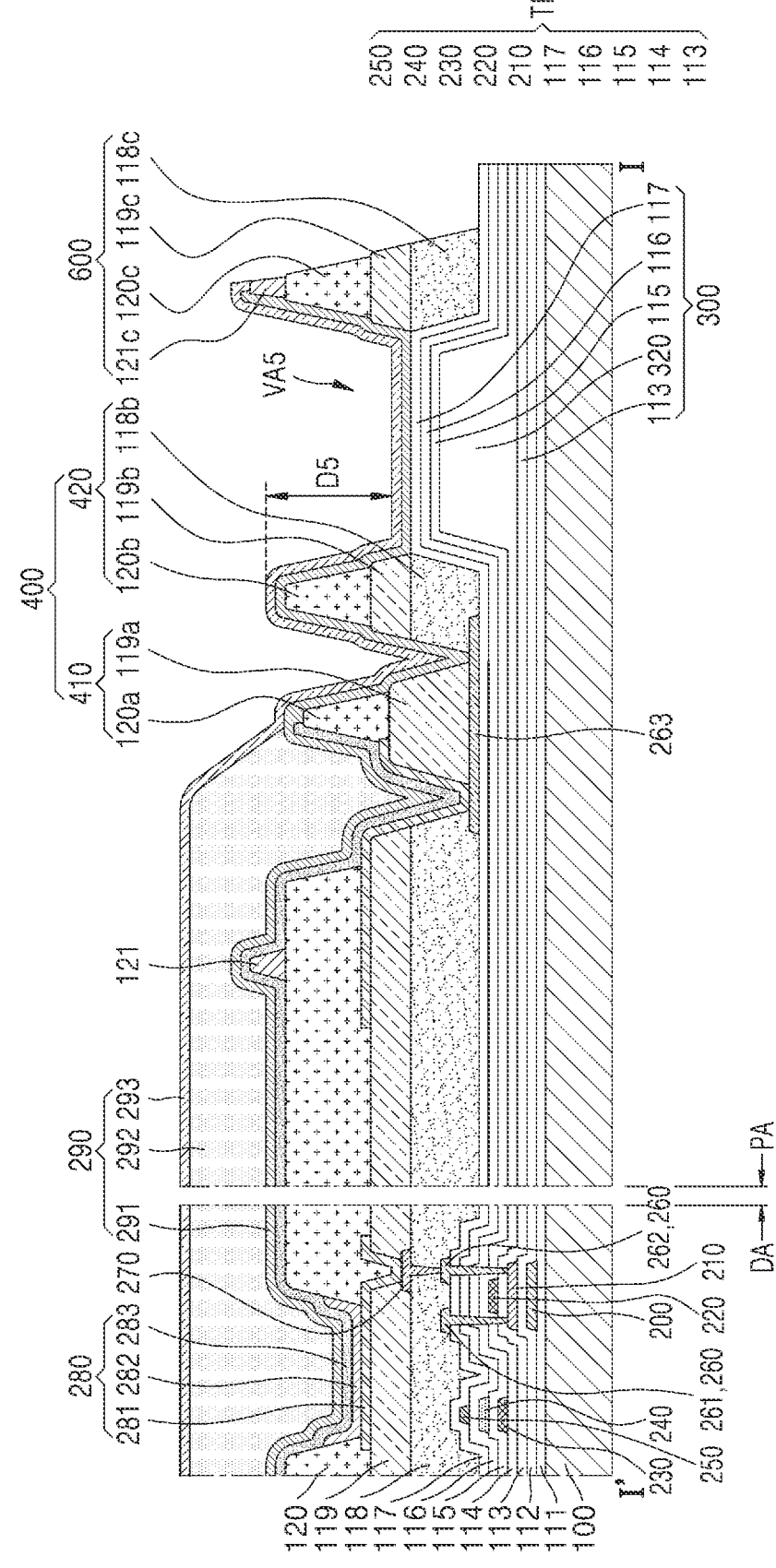
FIG. 7 is a cross-sectional view illustrating a portion of a display apparatus being manufactured according to an embodiment.

FIG. 7 a cross-sectional view illustrating the display apparatus 1 being manufactured according to an embodiment. Referring to FIG. 7, the residual film control dam 300 may include the first gate insulating layer 113, the second inorganic insulating layer 320, the second interlayer insulating layer 115, the second gate insulating layer 116, and the third interlayer insulating layer 117. The second inorganic insulating layer 320 may be a thick portion of the first interlayer insulating layer 114. Thicknesses of the first gate insulating layer 113, the second interlayer insulating layer 115, the second gate insulating layer 116, and the third interlayer insulating layer 117 in the residual film control dam 300 may be the same as those in the display area DA. Because the second inorganic insulating layer 320 is sufficiently thick, a fifth depth D5 of a fifth valley VA5 may be less than the second depth D2 of the second valley VA2 illustrated in FIG. 4. Accordingly, like in the first valley VA1, the residual film 700 does not significantly remain in the fifth valley VA5. Advantageously, defects may be prevented or minimized from occurring in a process of cutting the substrate 100.

Figure 8:
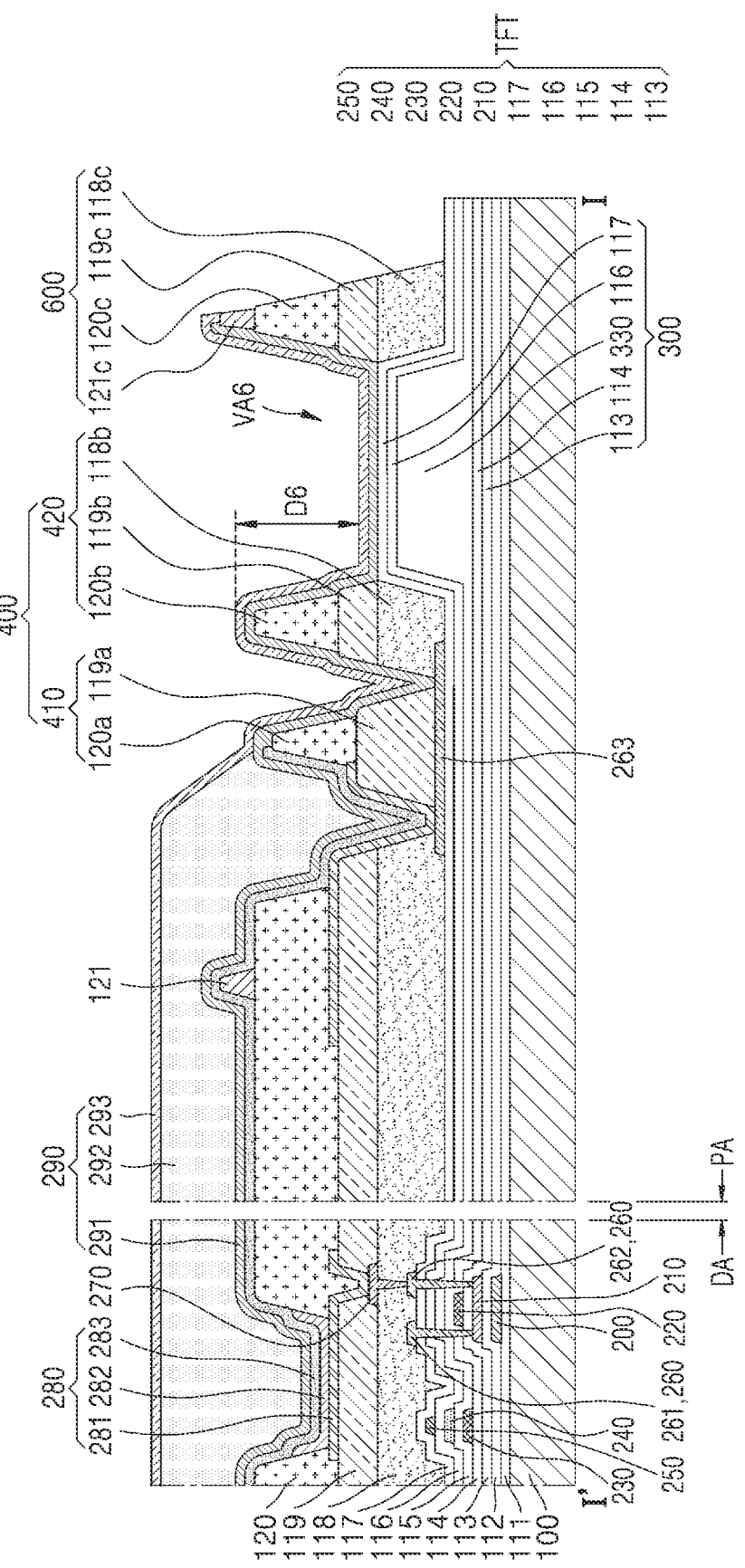
FIG. 8 is a cross-sectional view illustrating a portion of a display apparatus being manufactured according to an embodiment.

FIG. 8 is a cross-sectional view illustrating the display apparatus 1 being manufactured according to an embodiment. Referring to FIG. 8, the residual film control dam 300 may include the first gate insulating layer 113, the first interlayer insulating layer 114, the third inorganic insulating layer 330, the second gate insulating layer 116, and the third interlayer insulating layer 117. The third inorganic insulating layer 330 may correspond to a thick portion of the second interlayer insulating layer 115. Thicknesses of the first gate insulating layer 113, the first interlayer insulating layer 114, the second gate insulating layer 116, and the third interlayer insulating layer 117 in the residual film control dam 300 may be the same as those in the display area DA. Because the third inorganic insulating layer 330 is sufficiently thick, a sixth depth D6 of a sixth valley VA6 may be less than the second depth D2 of the second valley VA2 illustrated in FIG. 4. Accordingly, like in the first valley VA1, the residual film 700 does not significantly remain in the sixth valley VA6. Advantageously, defects may be prevented or minimized from occurring in a process of cutting the substrate 100.

Figure 9:
FIG. 9 is a cross-sectional view illustrating a portion of a display apparatus being manufactured according to an embodiment.

FIG. 9 is a cross-sectional view illustrating the display apparatus 1 being manufactured according to an embodiment. Referring to, the residual film control dam 300 may include the first gate insulating layer 113, the first interlayer insulating layer 114, the second interlayer insulating layer 115, the fourth inorganic insulating layer 340, and the third interlayer insulating layer 117. The fourth inorganic insulating layer 340 may be a thick portion of the second gate insulating layer 116. Thicknesses of the first gate insulating layer 113, the first interlayer insulating layer 114, the second interlayer insulating layer 115, and the third interlayer insulating layer 117 in the residual film control dam 300 may be the same as those in the display area DA. Because the fourth inorganic insulating layer 340 is sufficiently thick, a seventh depth D7 of a seventh valley VA7 may be less than the second depth D2 of the second valley VA2 illustrated in FIG. 4. Accordingly, like in the first valley VA1, the residual film 700 does not significantly remain in the seventh valley VA7. Advantageously, defects may be prevented or minimized from occurring in a process of cutting the substrate 100.

Figure 10:
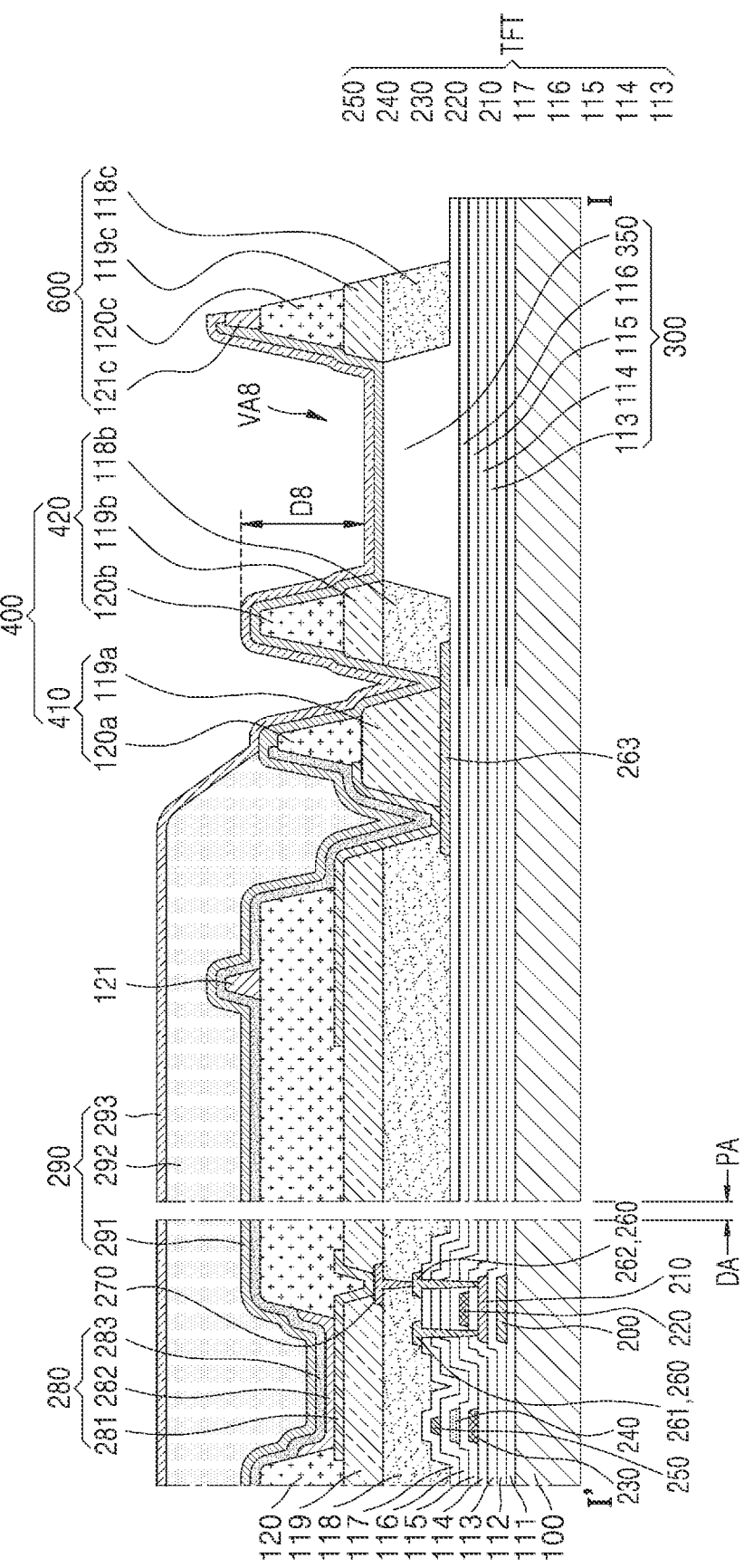
FIG. 10 is a cross-sectional view illustrating a portion of a display apparatus being manufactured according to an embodiment.

FIG. 10 is a cross-sectional view illustrating the display apparatus 1 being manufactured according to an embodiment. Referring to FIG. 10, the residual film control dam 300 may include the first gate insulating layer 113, the first interlayer insulating layer 114, the second interlayer insulating layer 115, the second gate insulating layer 116, and the fifth inorganic insulating layer 350. The fifth inorganic insulating layer 350 may be a thick portion of the third interlayer insulating layer 117. Thicknesses of the first gate insulating layer 113, the first interlayer insulating layer 114, the second interlayer insulating layer 115, and the second gate insulating layer 116 in the residual film control dam 300 may be the same as those in the display area DA. Because the fifth inorganic insulating layer 350 is sufficiently thick, an eighth depth D8 of an eighth valley VA8 may be less than the second depth D2 of the second valley VA2 of FIG. 4. Accordingly, like in the first valley VA1, the residual film 700 does not significantly remain in the eighth valley VA8. Advantageously, defects may be prevented or minimized from occurring in a process of cutting the substrate 100.

The residual film control dam 300 may include one or more inorganic insulating layers. For example, the residual film control dam 300 may include one or more of the first inorganic insulating layer 310 having a thickness greater than a thickness of the first gate insulating layer 113, the second inorganic insulating layer 320 having a thickness greater than a thickness of the second interlayer insulating layer 115, the third inorganic insulating layer 330 having a thickness greater than a thickness of the second interlayer insulating layer 115, the fourth inorganic insulating layer 340 having a thickness greater than a thickness of the second gate insulating layer 116, and the fifth inorganic insulating layer 350 having a thickness greater than a thickness of the third interlayer insulating layer 117.

A combined thickness of layers included in the residual film control dam 300 should be greater than a sum of thicknesses of the first gate insulating layer 113, the first interlayer insulating layer 114, the second interlayer insulating layer 115, the second gate insulating layer 116, and the third interlayer insulating layer 117.

A thickness of the first inorganic insulating layer 310 may be greater than a thickness of the first gate insulating layer 113, a thickness of the second inorganic insulating layer 320 may be greater than a thickness of the first interlayer insulating layer 114, a thickness of the third inorganic insulating layer 330 may be greater than a thickness of the second interlayer insulating layer 115, a thickness of the fourth inorganic insulating layer 340 may be greater than a thickness of the second gate insulating layer 116, and/or a thickness of the fifth inorganic insulating layer 350 may be greater than a thickness of the third interlayer insulating layer 117.

A sum of thicknesses of the inorganic insulating layers 310, 320, 330, 340, and layer 350 is greater than a sum of thicknesses of the first gate insulating layer 113, the first interlayer insulating layer 114, the second interlayer insulating layer 115, the second gate insulating layer 116, and the third interlayer insulating layer 117. Nevertheless, a thickness of the first inorganic insulating layer 310 may be less than a thickness of the first gate insulating layer 113, a thickness of the second inorganic insulating layer 320 may be less than a thickness of the first interlayer insulating layer 114, a thickness of the third inorganic insulating layer 330 may be less than a thickness of the second interlayer insulating layer 115, a thickness of the fourth inorganic insulating layer 340 may be less than a thickness of the second gate insulating layer 116, or a thickness of the fifth inorganic insulating layer 350 may be less than a thickness of the third interlayer insulating layer 117.

Figure 11:
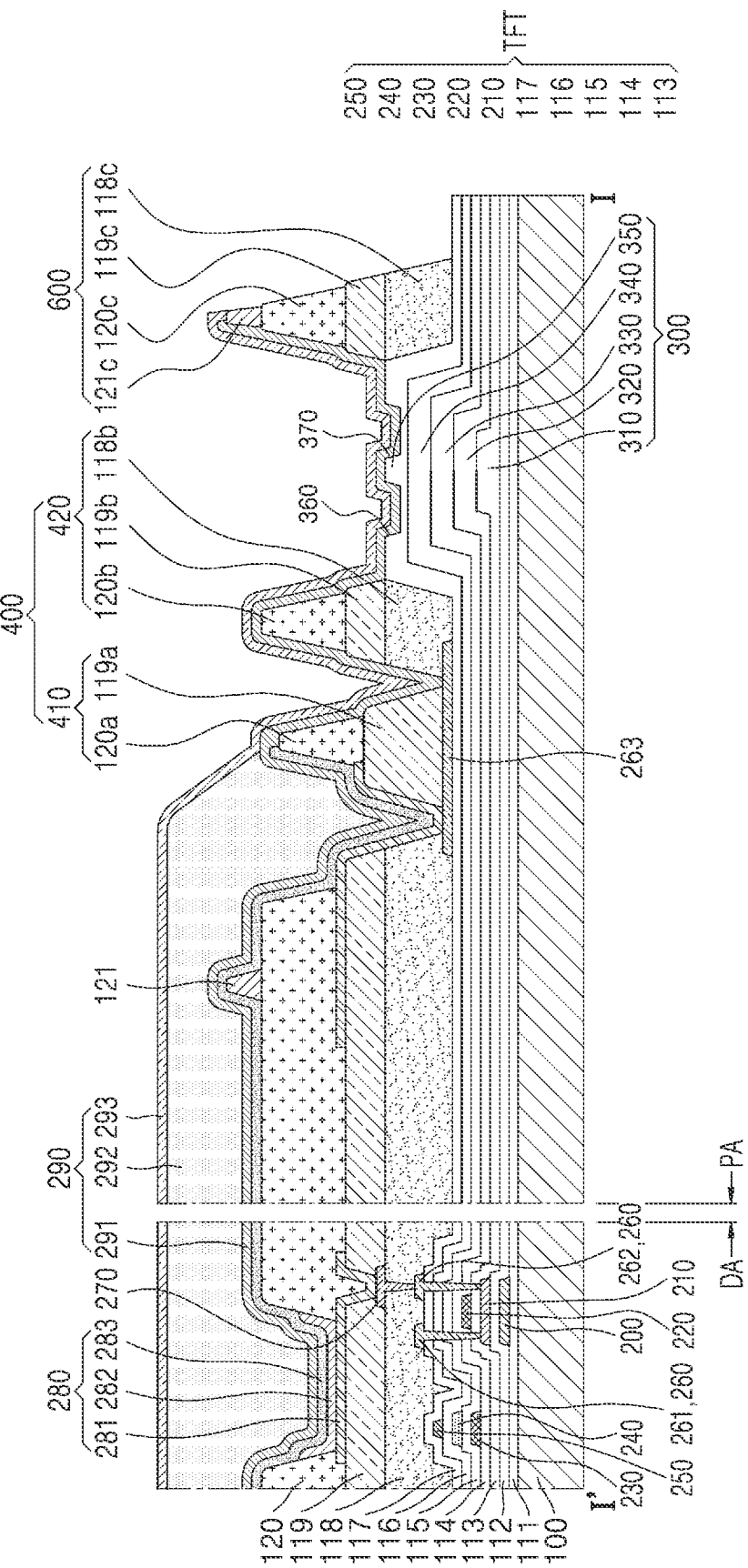
FIG. 11 is a cross-sectional view illustrating a display apparatus being manufactured according to an embodiment.

FIG. 11 is a cross-sectional view illustrating a display apparatus being manufactured according to an embodiment. Referring to FIG. 11, first and second grooves 360 and 370 may be formed in a top surface of the residual film control dam 300, may extend between the first dam structure 400 and the second dam structure 600, and may be located between two opposite lateral sides of the residual control dam 300. One or more grooves may be formed in a top surface of the fifth inorganic insulating layer 350 included in the residual film control dam 300. The first and second grooves 360 and 370 may be formed using a halftone mask. The first groove 360 may be adjacent to the first dam structure 400, and the second groove 370 may be adjacent to the second dam structure 600. The first inorganic encapsulation layer 291 and the second inorganic encapsulation layer 293 included in the encapsulation layer 290 may cover the residual film control dam 300. Because the first inorganic encapsulation layer 291 and the second inorganic encapsulation layer 293 are formed along underlying structures, a top surface of the second inorganic encapsulation layer 293 has grooves corresponding to the first and second grooves 360 and 370. The first inorganic encapsulation layer 291 (and the second inorganic encapsulation layer 293) may be partially positioned inside the grooves 360 and 370).

The first and second grooves 360 and 370 may surround the display area DA in a plan view of the display apparatus 1. During manufacturing the display apparatus 2 (shown in FIG. 13A), even if cracks occur in the residual film control dam 300 and grow along the residual film control dam 300 when the substrate 100 is cut, the cracks may grow toward the dam structure(s) 400 and/or 600 and then may be blocked by the groove(s) 360 and/or 370. Accordingly, growth of cracks toward the display area DA may be prevented or minimized.

Figure 12:
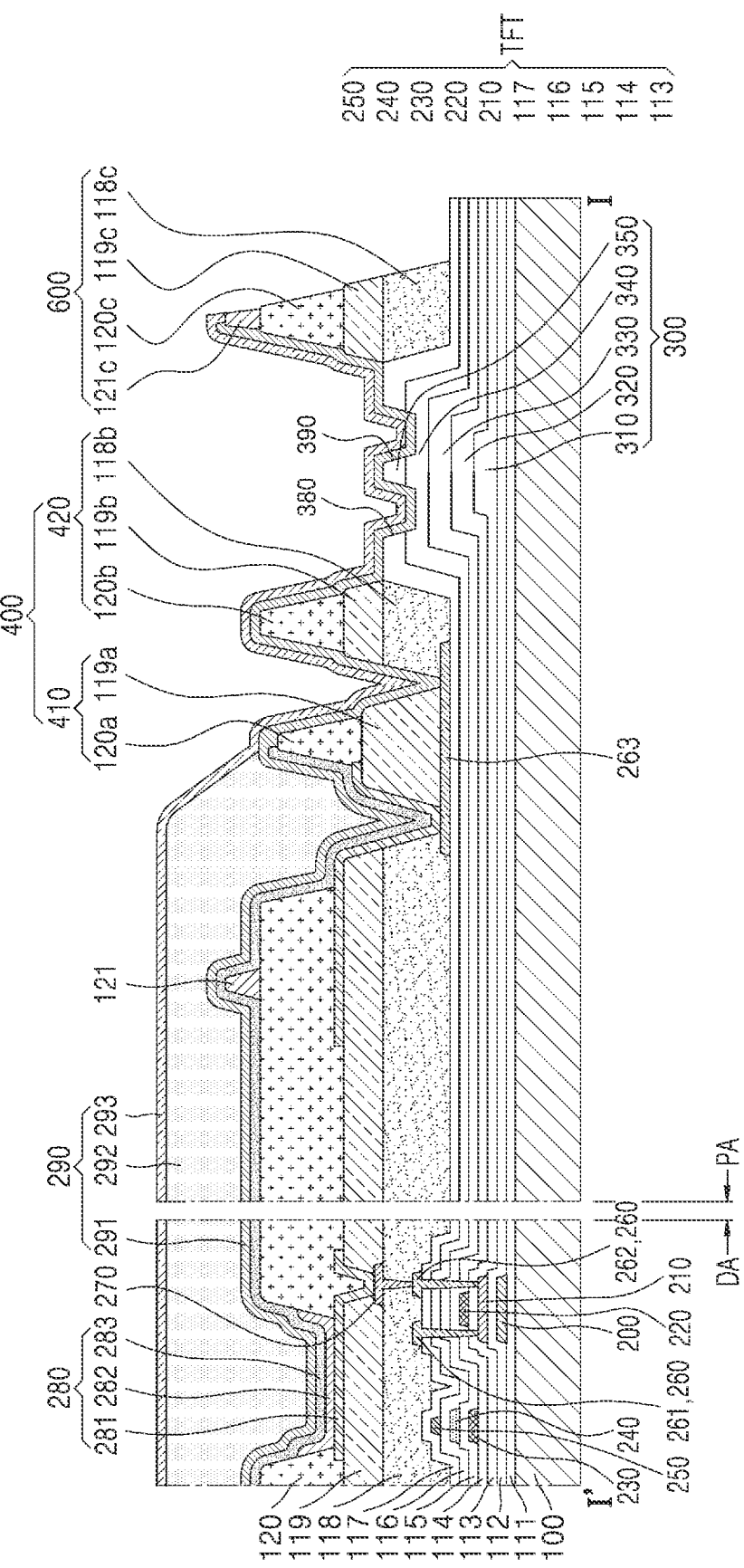
FIG. 12 is a cross-sectional view illustrating a display apparatus being manufactured according to an embodiment.

FIG. 12 is a cross-sectional view illustrating a display apparatus being manufactured according to an embodiment. Referring to FIG. 12, a third groove 380 and a fourth groove 390 may be formed in a top surface of the residual film control dam 300 and may pass through the fifth inorganic insulating layer 350. A depth of each of the grooves 380 and 390 may be less than a sum of thicknesses of the inorganic insulating layers 310, 320, 330, 340, and 350 included in the residual film control dam 300.

Figure 13A:
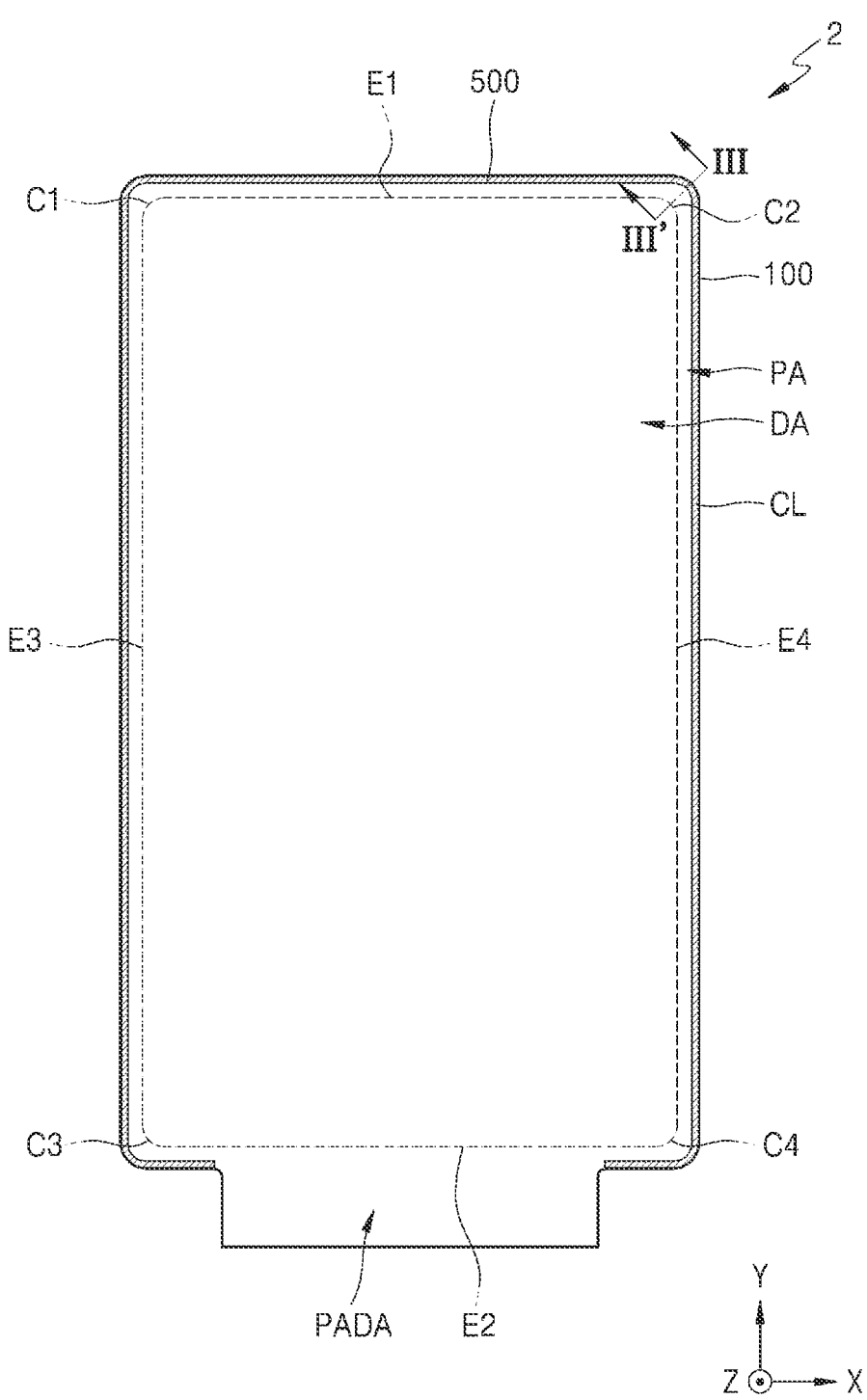
FIG. 13A is a plan view illustrating a display apparatus according to an embodiment and FIG. 13B is a plan view illustrating a display apparatus according to an embodiment.
Figure 13B:
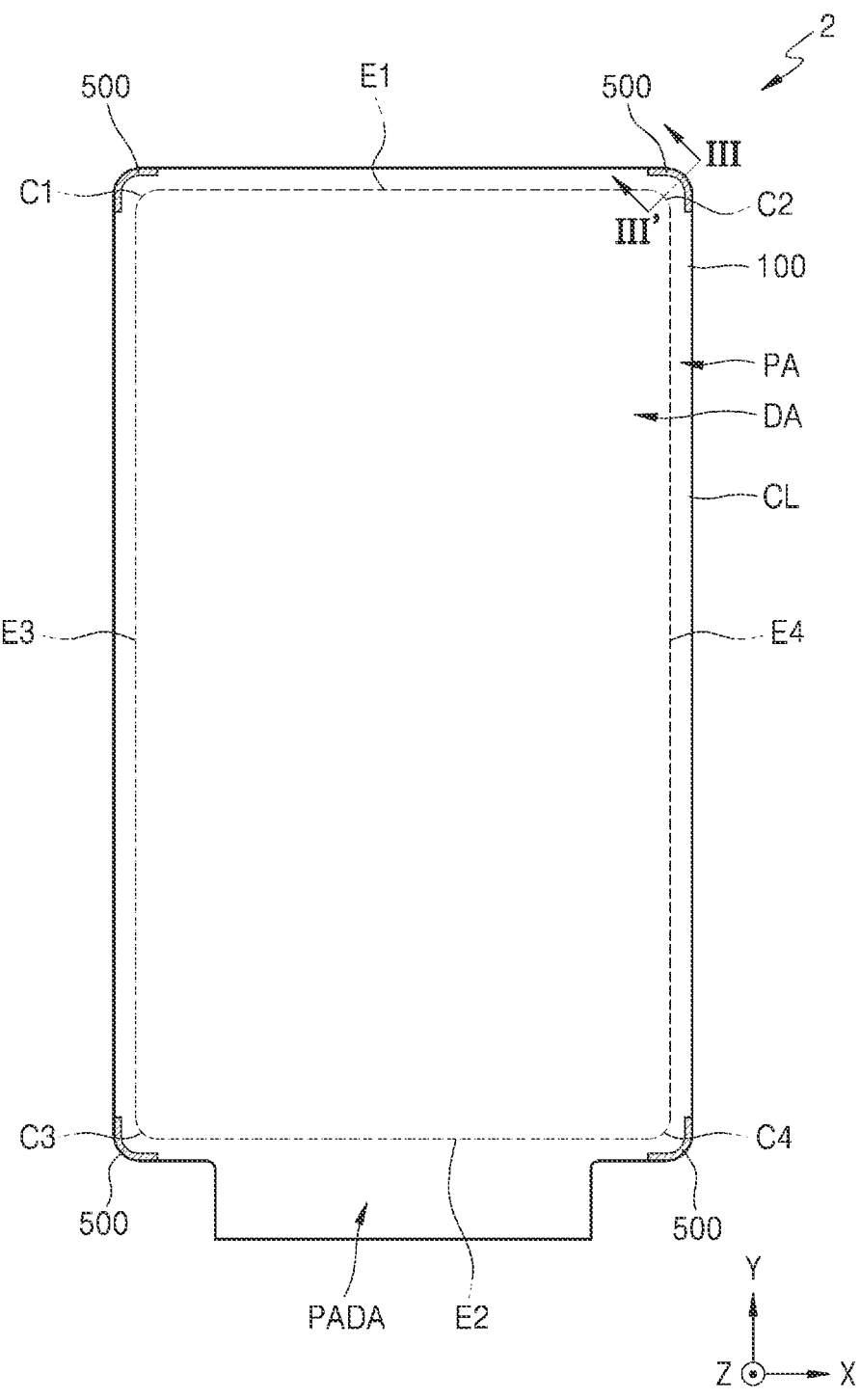

FIG. 13A is a plan view illustrating the display apparatus 2 according to an embodiment and FIG. 13B is a plan view illustrating a display apparatus 2 according to an embodiment. The display apparatus 2 includes the display area DA and peripheral area PA corresponding to the display area DA and peripheral area PA of the substrate 100. The display apparatus 2 may be obtained after the cutting area CA has been removed from the display apparatus 1 shown in FIG. 2.

Figure 14:
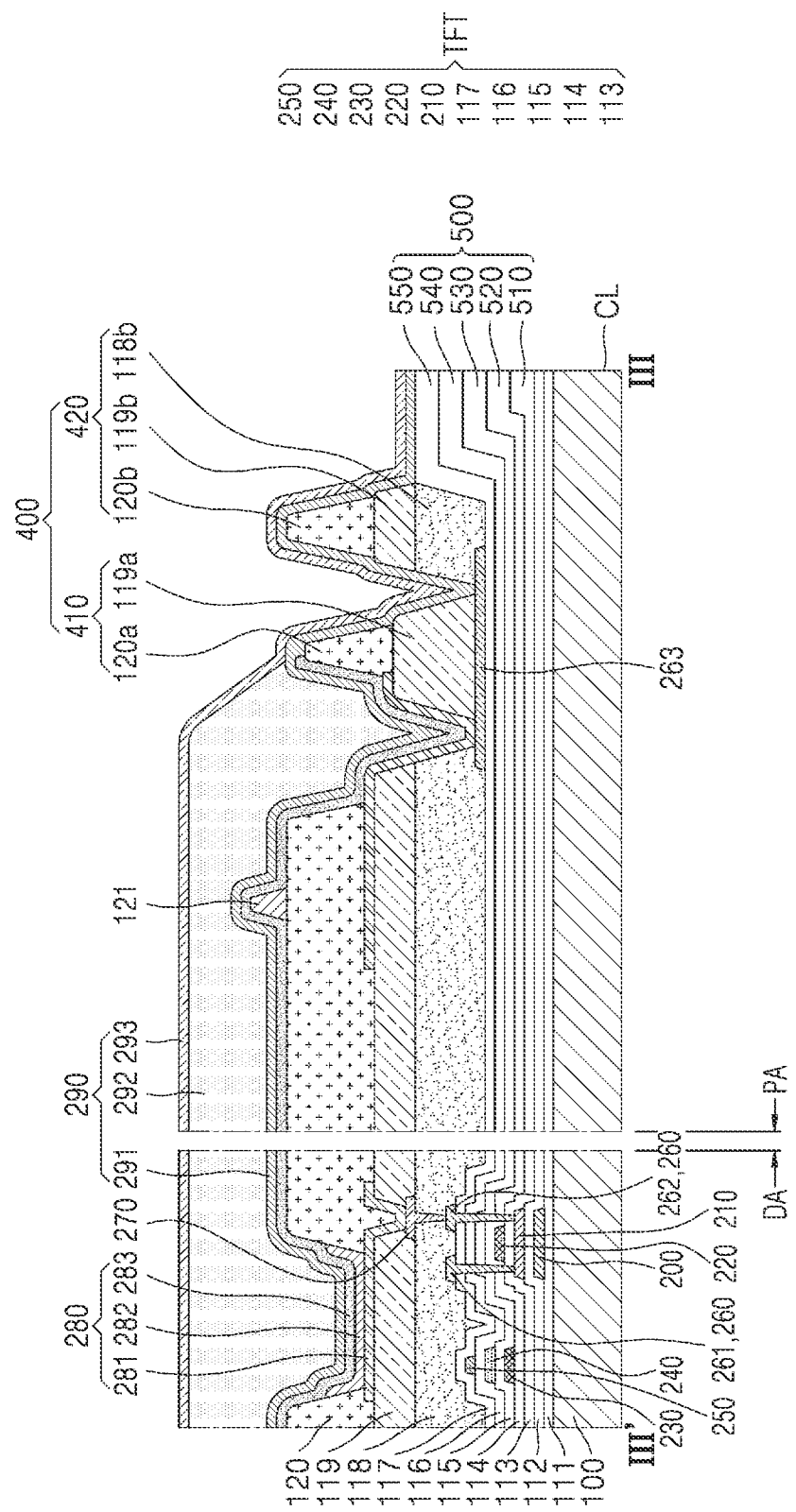
FIG. 14 is a cross-sectional view taken along line III-III' of FIG. 13A according to an embodiment.

FIG. 14 is a cross-sectional view taken along line III-III' of FIG. 13A according to an embodiment. As shown in FIG. 14, the thin-film transistor layer TFT may be located on the substrate 100. Although the thin-film transistor layer TFT exists only on the display area DA in FIG. 14, the thin-film transistor layer TFT may also be located on the peripheral area PA outside the display area DA. The thin-film transistor layer TFT may be electrically connected to the display device 280 located in the display area DA.

The thin-film transistor layer TFT may include the first semiconductor layer 210 located on the substrate 100, the first gate insulating layer 113 covering the first semiconductor layer 210, and the first gate layer 220 located on the first gate insulating layer 113. The thin-film transistor layer TFT may further include the first interlayer insulating layer 114 covering the first gate layer 220, the conductive layer 230 located on the first interlayer insulating layer 114, and the second interlayer insulating layer 115 covering the conductive layer 230. The thin-film transistor layer TFT may further include the second semiconductor layer 240 located on the second interlayer insulating layer 115, the second gate insulating layer 116 covering the second semiconductor layer 240, the second gate layer 250 located on the second gate insulating layer 116, and the third interlayer insulating layer 117 covering the second gate layer 250.

A residual film control dam 500 (or insulating material stack 500) and the first dam structure 400 may be located on the substrate 100. The residual film control dam 500 overlaps the peripheral area PA of the substrate 100 and is located outside the display area DA of the substrate 100, and the first dam structure 400 is substantially located between the residual film control dam 500 and the display area DA. The first dam structure 400 may cover a part of the residual film control dam 500. A height of the first dam structure 400 may be greater than a height of the residual film control dam 500 with reference to the substrate 100; i.e., the first dam structure 400 may reach farther than the residual film control dam 500 with reference to the substrate 100. Referring to FIG. 13A, the residual film control dam 500 may completely or partially surround the display area DA in a plan view of the display apparatus 2. Referring to FIG. 13B, the residual film control dam 500 may extend along the first through fourth corner portions C1, C2, C3, and C4 of the display area DA. The residual film control dam 500 may not substantially extend along the edge portions E1, E2, E3, and E4 between the first through fourth corner portions C1, C2, C3, and C4.

The residual film control dam 500 may include inorganic insulating films 510, 520, 530, 540, and 550. The inorganic insulating films 510 through 550 may be obtained by removing parts of the inorganic insulating films 310 through 350 through cutting of the substrate 100.

The first inorganic insulating layer 510 may include the same material as that of the first gate insulating layer 113 of the thin-film transistor layer TFT. The first inorganic insulating layer 510 may be integrally formed with the first gate insulating layer 113. The second inorganic insulating layer 520 may include the same material as that of the first interlayer insulating layer 114 of the thin-film transistor layer TFT. The second inorganic insulating layer 520 may be integrally formed with the first interlayer insulating layer 114.

The third inorganic insulating layer 530 may include the same material as that of the second interlayer insulating layer 115 of the thin-film transistor layer TFT. The third inorganic insulating layer 530 may be integrally formed with the second interlayer insulating layer 115. The fourth inorganic insulating layer 540 may include the same material as that of the second gate insulating layer 116 of the thin-film transistor layer TFT. The fourth inorganic insulating layer 540 may be integrally formed with the second gate insulating layer 116. The fifth inorganic insulating layer 550 may include the same material as that of the third interlayer insulating layer 117 of the thin-film transistor layer TFT. The fifth inorganic insulating layer 550 may be integrally formed with the third interlayer insulating layer 117.

The first inorganic insulating layer 510 may be thicker than the first gate insulating layer 113 (in a Z-axis direction perpendicular to the substrate 100). The second inorganic insulating layer 520 may be thicker than the first interlayer insulating layer 114. The third inorganic insulating layer 530 may be thicker than the second interlayer insulating layer 115. The fourth inorganic insulating layer 540 may be thicker than the second gate insulating layer 116. The fifth inorganic insulating layer 550 may be thicker than the third interlayer insulating layer 117. Accordingly, a sum of thicknesses of the inorganic insulating layers 510 through 550 may be greater than a sum of thicknesses of the first gate insulating layer 113, the first interlayer insulating layer 114, the second interlayer insulating layer 115, the second gate insulating layer 116, and the third interlayer insulating layer 117 in the Z-axis direction perpendicular to the substrate 100.

The residual film control dam 500 may include at least one of the inorganic insulating layers 510, 520, 530, 540, and 550. A sum of thicknesses of the layer(s) included in the residual film control dam 500 should be greater than a sum of thicknesses of the first gate insulating layer 113, the first interlayer insulating layer 114, the second interlayer insulating layer 115, the second gate insulating layer 116, and the third interlayer insulating layer 117.

Figure 15:
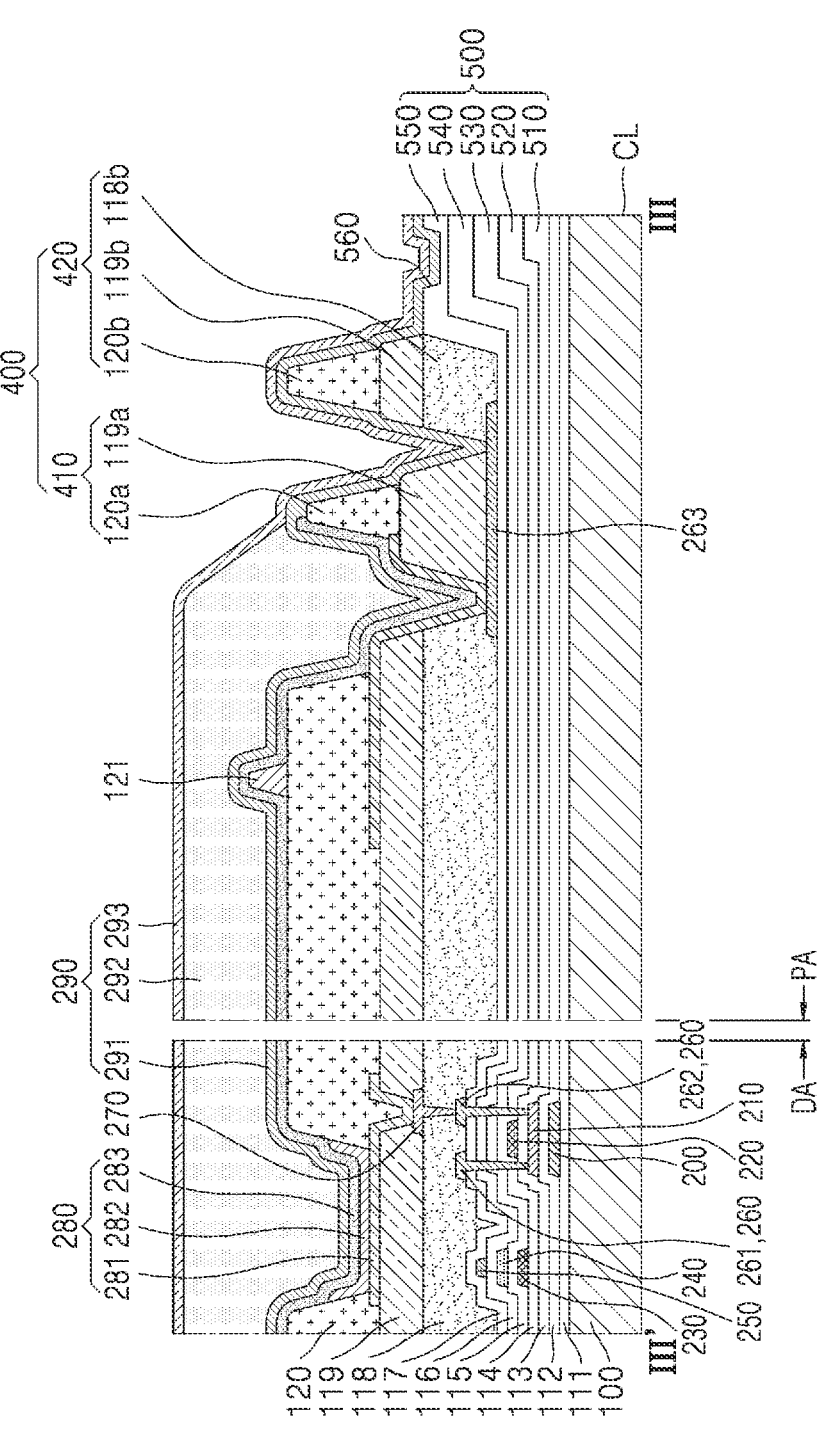
FIG. 15 is a cross-sectional view illustrating a portion of a display apparatus according to an embodiment.

FIG. 15 is a cross-sectional view illustrating a portion of a display apparatus according to an embodiment. As shown in FIG. 15, the residual film control dam 500 may include a fifth groove 560 located between two opposite lateral sides of the residual film control dam 500. The first inorganic encapsulation layer 291 and the second inorganic encapsulation layer 293 included in the encapsulation layer 290 may cover a top surface of the residual film control dam 500. Because the first inorganic encapsulation layer 291 and the second inorganic encapsulation layer 293 are formed along underlying structures, a top surface of the second inorganic encapsulation layer 293 has a groove corresponding to the fifth groove 560. The first inorganic encapsulation layer 291 (and the second inorganic encapsulation layer 293) may be partially positioned inside the fifth groove 560. The fifth groove 560 may surround the display area DA in a plan view of the display apparatus.

According to embodiments, defects of a display apparatus may be minimized. Advantageously, the quality and performance of the display apparatus may be satisfactory.

The described embodiments should be considered in an illustrative sense and not for purposes of limitation. Descriptions of features or aspects within each embodiment should typically be considered as available for other similar features or aspects in other embodiments. While embodiments have been described with reference to the figures, various changes in form and details may be made in the described embodiments without departing from the scope defined by the following claims.

What is claimed is:

1. A method for manufacturing a display apparatus, the method comprising:

forming an inorganic insulating layer on a substrate, the substrate comprising a display area and a peripheral area, the inorganic insulating layer comprising a first portion and a second portion, the first portion overlapping the display area, the second portion overlapping the peripheral area and being thicker than the first portion in a direction perpendicular to the substrate;

forming a first dam structure and a second dam structure that overlap the substrate, the first dam structure being located closer to the display area than the second portion, the second portion being located closer to the display area than the second dam structure wherein the first dam structure is at least partly formed on a first side of the thick second portion and the second dam structure being at least partly formed on a second side of the thick second portion; and removing a part of the substrate overlapped by the second dam structure by emitting a laser beam to at least the second portion.

2. The method of claim 1, further comprising forming a first semiconductor layer that overlaps the substrate, wherein the inorganic insulating layer covers the first semiconductor layer.

3. The method of claim 1, further comprising:

forming a first semiconductor layer that overlaps the substrate; and forming a first gate layer that overlaps the first semiconductor layer, wherein the inorganic insulating layer covers the first gate layer.

4. The method of claim 1, further comprising:

forming a first semiconductor layer that overlaps the substrate;

forming a first gate layer that overlaps the first semiconductor layer; and forming a conductive layer that overlaps the first gate layer, wherein the inorganic insulating layer covers the conductive layer.

5. The method of claim 1, further comprising:

forming a first semiconductor layer that overlaps the substrate;

forming a first gate layer that overlaps the first semiconductor layer;

forming a conductive layer that overlaps the first gate layer; and forming a second semiconductor layer that overlaps the conductive layer, wherein the inorganic insulating layer covers the second semiconductor layer.

6. The method of claim 1, further comprising:

forming a first semiconductor layer that overlaps the substrate;

forming a first gate layer that overlaps the first semiconductor layer;

forming a conductive layer that overlaps the first gate layer;

forming a second semiconductor layer that overlaps the conductive layer; and forming a second gate layer that overlaps the second semiconductor layer, wherein the inorganic insulating layer covers the second gate layer.

7. The method of claim 1, further comprising:

forming a first semiconductor layer that overlaps the substrate;

forming a first gate layer that overlaps the first semiconductor layer;

forming a conductive layer that overlaps the first gate layer;

forming a second semiconductor layer that overlaps the conductive layer; and forming a second gate layer that overlaps the second semiconductor layer, wherein the forming of the inorganic insulating layer comprises:

forming a first inorganic insulating layer covering the first semiconductor layer;

forming a second inorganic insulating layer covering the first gate layer;

forming a third inorganic insulating layer covering the conductive layer;

forming a fourth inorganic insulating layer covering the second semiconductor layer; and forming a fifth inorganic insulating layer covering the second gate layer.

\* \* \* \* \*